(12) United States Patent
Nakagawa et al.

(10) Patent No.: US 6,323,634 B1
(45) Date of Patent: Nov. 27, 2001

(54) MAGNETIC SENSOR APPARATUS, CURRENT SENSOR APPARATUS AND MAGNETIC SENSOR ELEMENT

(75) Inventors: Shiro Nakagawa; Katsuaki Tanaka; Katsumi Yabusaki; Yoshihisa Okita, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/484,793

(22) Filed: Jan. 18, 2000

Related U.S. Application Data

(63) Continuation of application No. PCT/JP99/03586, filed on Jul. 2, 1999.

(30) Foreign Application Priority Data

Oct. 14, 1998 (JP) .................................................. 10-292494
Jan. 20, 1999 (JP) .................................................. 11-011512

(51) Int. Cl.[7] ...................................................... G01R 33/00
(52) U.S. Cl. ........................................................... 324/117 R
(58) Field of Search ................................. 324/202, 207.2, 324/232, 239, 244, 246, 117 R, 117 H, 251, 252, 253, 260; 361/267

(56) References Cited

U.S. PATENT DOCUMENTS

| | | | |
|---|---|---|---|
| 4,439,732 | * | 3/1984 | Hesterman et al. ................. 324/247 |
| 4,503,395 | | 3/1985 | Kratzer et al. . |
| 6,183,889 | * | 2/2001 | Koshiba et al. ..................... 428/692 |

FOREIGN PATENT DOCUMENTS

| | | |
|---|---|---|
| A-60-185179 | 9/1985 | (JP) . |
| A-62-22088 | 1/1987 | (JP) . |
| B2-62-55111 | 11/1987 | (JP) . |
| B2-63-52712 | 10/1988 | (JP) . |
| B2-63-57741 | 11/1988 | (JP) . |
| Y2-7-23751 | 5/1995 | (JP) . |
| A-9-61506 | 3/1997 | (JP) . |
| A-9-257835 | 10/1997 | (JP) . |

* cited by examiner

*Primary Examiner*—Safet Metjahic
*Assistant Examiner*—Etienne P LeRoux
(74) *Attorney, Agent, or Firm*—Oliff & Berridge PLC

(57) ABSTRACT

A magnetic sensor apparatus comprises a magnetic detector (101) that outputs a signal responsive to a magnetic field and a magnetic substance (110) having a cavity (111) in which the magnetic detector (101) is placed. The magnetic detector (101) is placed in the cavity (111) of the magnetic substance (110). The ratio between a magnetic field (H) to be measured and a magnetic field applied to the magnetic detector (101) is set to a specific value, based on at least one of a first demagnetizing factor depending on the shape of the magnetic substance (110) and a second demagnetizing factor depending on the shape of the cavity (111). The magnetic sensor apparatus further comprises a feedback coil (112) that applies a negative feedback magnetic field to the magnetic detector (101) and a reference magnetic field coil (113) that applies a reference alternating magnetic filed to the magnetic detector (101) for controlling the property of the magnetic detector (101).

32 Claims, 8 Drawing Sheets

MAGNETIC SENSOR APPARATUS, CURRENT SENSOR APPARATUS AND MAGNETIC SENSOR ELEMENT

This is a continuation of Application No. PCT/JP99/03586 filed Jul. 2, 1999. The entire disclosure of the prior application(s) is hereby incorporated by reference herein in its entirety.

TECHNICAL FIELD

The present invention relates to a magnetic sensor apparatus for measuring a magnetic field, a current sensor apparatus for measuring an electric current through measuring a magnetic field generated by the current, and a magnetic sensor element for measuring a magnetic field.

BACKGROUND ART

Many types of magnetic sensor apparatuses and non-contact-type electric current sensor apparatuses utilizing magnetic sensor apparatuses have been long developed since such apparatuses are useful in industry. However, their application fields have been limited and the market scale have been thus limited. Consequently, development of such apparatuses in terms of cost reduction have not been fully achieved yet.

However, emission control originating from the need for solving environmental problems has accelerated development of electric automobiles and solar-electric power generation. Since a direct current of several kilowatts to tens of kilowatts is dealt with in an electric car or solar-electric power generation, a non-contact current sensor apparatus is required for measuring a direct current of tens to hundreds of amperes. The demand for such current sensor apparatuses is extremely high. It is therefore difficult to increase the popularity of electric automobiles and solar-electric power generation unless the current sensor apparatuses not only exhibit excellent properties but also are extremely low-priced. In addition, reliability is required for a period of time as long as 10 years or more for a current sensor apparatus used in a harsh environment as in an electric car. As thus described, it has been requested in society to provide current sensor apparatuses that are inexpensive and have excellent properties and long-term reliability.

For non-contact measurement of an electric current, an alternating current component is easily measured through the use of the principle of a transformer. However, it is impossible to measure a direct current component through this method. Therefore, a method is taken to measure a magnetic field where a current is generated through a magnetic sensor for measuring a direct current component. In general, such a current sensor apparatus has a configuration including a magnetic yoke interlinking a current to be measured and having a gap in which a magnetic sensor element of a magnetic sensor apparatus is placed. A Hall element is widely used as such a magnetic sensor element incorporated in such a current sensor apparatus. A magnetoresistive (MR) element and a fluxgate element are used in some applications, too.

In applications such as an electric car or solar-electric power generation mentioned above, a current to be measured is 10 to 500 amperes. Therefore, a Hall element or a giant magnetoresistive (GMR) element suitable for measuring a high magnetic field is mainly used as a magnetic sensor element.

Not only for a current sensor apparatus incorporating a Hall element or a GMR element but also for a current sensor apparatus in general, a technique has been known for improving linearity and the dependence of output on temperature. That is, as disclosed in Published Unexamined Japanese Patent Application Sho 62-22088 (1987), for example, based on an output of a magnetic sensor apparatus, a magnetic field is generated in the direction opposite to a magnetic field to be measured that is produced by a current to be measured. Negative feedback of the output of the magnetic sensor apparatus is thereby achieved, such that the apparatus operates in the state where the magnetic field in the magnetic yoke is nearly zero, that is, in the state where the field applied to the apparatus is nearly zero. This technique is hereinafter called a negative feedback method.

For a current sensor apparatus, as disclosed in Published Examined Japanese Patent Application Sho 63-57741 (1988), for example, a technique has been known for improving measurement accuracy. That is, a specific alternating magnetic field is superposed on a magnetic field to be measured that is produced by a current to be measured. Control is performed to constantly maintain an output of the magnetic sensor apparatus responsive to the alternating magnetic field. This technique is hereinafter called an alternating current superposing method.

Various types of magnetic sensor elements have been known, such as a Hall element, an MR element, a GMR element and a fluxgate element. Each of theses elements has its own suitable measurement range of magnetic fields. Therefore, it has been required in prior art to choose a magnetic sensor element in accordance with the magnitude of a magnetic field to be measured. However, each element has its own properties such as output magnitude, linearity, and dependence on temperature. Consequently, desired accuracy is not always achieved even though a magnetic sensor element that provides a measurement range suitable for magnetic fields to be measured is chosen. Another problem is that, in some cases, no magnetic sensor element that provides a measurement range suitable for fields to be measured is available.

As described above, the negative feedback method may be applied for improving linearity and the dependence of output on temperature. However, the negative feedback method requires the generation of a negative feedback magnetic field in the opposite direction that is equal in magnitude to the field produced by the current to be measured. To measure a current of 100 amperes, for example, a feedback current of 1 ampere is required even though the number of turns of the coil for generating the negative feedback field is 100. As a result, the negative feedback method causes secondary problems such as an increase in coil dimensions, power loss, and heating. It is difficult in the prior art to solve these problems.

Furthermore, in the negative feedback method, the magnetic sensor element constantly operates in the state where the magnetic field is nearly zero. Therefore, if a Hall element whose output is small is used as the magnetic sensor element, the element is strongly affected by drifts of its own or the direct current amplification circuit and the accuracy is reduced.

With regard to a GMR element, although its output is large, it is impossible to determine the direction of a magnetic field to be measured (or the direction of a current to be measured in the case of a current sensor apparatus) since the magnetoresistive effect thereof is independent of the direction of the magnetic field. Therefore, in order to measure a magnetic field through a GMR element in the prior art, a bias magnetic field is applied such that the output of the magnetic sensor element monotonously changes in response to change in the field to be measured. In this case, however, if the direction of the field of the field to be measured is opposite to that of the bias field and the absolute value of the field to be measured exceeds that of the bias field, it is impossible to maintain the monotonicity of the output of magnetic sensor apparatus in response to changes in the field to be measured. Consequently, the negative feedback system may run away if the negative feedback method is applied.

The alternating current superposing method is a technique for improving accuracy, too. However, this method is applicable on condition that linearity of the magnetic sensor apparatus is ensured. Using this method only is thus not enough to improve linearity.

As described so far, it is impossible to measure a magnetic field or an electric current having a specific magnitude, or a great magnitude in particular, with accuracy, through the use of a magnetic sensor apparatus or a current sensor apparatus of prior art.

For example, the following problems have been found in the current sensor apparatus utilizing a Hall element that has been most highly developed in prior art.

(1) low sensitivity (2) inconsistent sensitivity (3) poor thermal characteristic (4) offset voltage that requires troublesome handling In addition to the above problems, a magnetoresistive element has a problem of poor linearity.

Some methods have been developed for solving the problems of a Hall element. One of the methods is the negative feedback method described above. In this method, a reversed magnetic field proportional to an output of the magnetic sensor element is applied to the element so as to apply negative feedback, such that the output of the element is kept constant. Consistency in sensitivity, the thermal characteristic, and linearity are thereby improved.

When the negative feedback method is used, however, it is required to apply an inverse magnetic field as large as the field to be measured to the element. Consequently, when a current as high as hundreds of amperes is measured in applications such as an electric car or solar-electric power generation, a feedback current obtained is several amperes even if the number of turns of the coil for generating a negative feedback field is 100. Therefore, a current sensor apparatus embodied through this method is very large-sized and expensive.

If the magnetic sensor element has high sensitivity, it is possible that a feedback current is reduced by applying only part (such as one hundredth) of the field to be measured to the element. However, this is difficult for a Hall element with low sensitivity used as the magnetic sensor element.

A fluxgate element has been developed mainly for measurement of a small magnetic field while not many developments have been made in techniques for measuring a large current. However, with some modification a fluxgate element may be used as a magnetic detector of a current sensor apparatus for a large current since the fluxgate element has a simple configuration and high sensitivity.

Reference is now made to FIG. 13 to describe the operation principle of a fluxgate element having the simplest configuration. FIG. 13 is a plot for showing the relationship between an inductance of a coil wound around a magnetic core and a coil current. Since the core has a magnetic saturation property, the effective permeability of the core is reduced and the inductance of the coil is reduced if the coil current increases. Therefore, if bias magnetic field B is applied to the core by a magnet and the like, the magnitude of external magnetic field $H_o$ is measured as a change in inductance of the coil when external field $H_o$ is superposed on the bias field. This is the operation principle of the simplest fluxgate element. In FIG. 13 each of bias field B and external field $H_o$ is expressed in the magnitude converted to the coil current.

In this method the position of bias point B changes with factors such as the intensity of the magnetic field generated by the magnet or the positions of the magnet and the core in relation to each other. It is therefore required to maintain the inductance at a specific value when the external magnetic field is zero. However, it is extremely difficult to compensate for the instability of the inductance value due to temperature changes and other external perturbations. This method is therefore not suitable for practical applications.

If a rod-shaped magnetic core is used, an open magnetic circuit is provided, so that the effect of hysteresis is generally very small. Assuming that the hysteresis of the core is negligible, the characteristic of variations in inductance is equal when the coil current flows in the positive direction and in the negative direction since the saturation characteristic of the core is independent of the direction of coil current. For example, in FIG. 13, it is assumed that point P+ and point P. represent the coil current in the positive direction and the coil current in the negative direction, respectively, whose absolute values are equal. In the neighborhood of these points, the characteristic of variations in inductance with respect to variations in the absolute value of the coil current is equal. Therefore, an alternating current may be applied to the coil such that the core is driven into a saturation region at a peak, and the difference in the amounts of decrease in inductance may be measured when positive and negative peak values of the current are obtained. As a result, the difference thus measured is constantly zero when the external magnetic field is zero, which is always the case even when the characteristics of the core change due to temperature changes or external perturbations. In the present invention a saturation region of the magnetic core means a region where an absolute value of the magnetic field is greater than the absolute value of the magnetic field obtained when the permeability of the core is maximum.

An external magnetic field is assumed to be applied to the core. If external field $H_o$ is applied in the positive direction of the current, as shown in FIG. 13, the inductance value decreases at the positive peak of the current (point Q+ in FIG. 13, for example) and the inductance value increases at the negative peak of the current (point Q– in FIG. 13, for example). Therefore, the difference between the values is other than zero. Since the difference in inductance depends on the external magnetic field, the external field is obtained by measuring the difference in inductance.

The method thus described is called a large amplitude excitation method in the present invention, that is, to apply an alternating current to the coil such that the core is driven into a saturation region at a peak, and to measure the difference in the amounts of decrease in inductance when positive and negative peak values of the current are obtained.

Magnetic sensor apparatuses that utilize such a large amplitude excitation method are disclosed in Published Examined Japanese Patent Application Sho 62-55111 (1987), Published Examined Japanese Patent Application Sho 63-52712 (1988), and Published Unexamined Japanese Patent Application Hei 9-61506 (1997), for example. In Published Examined Japanese Utility Model Application Hei 7-23751 (1995), a technique is disclosed to achieve measurement similar to the large amplitude excitation method through the use of two bias magnets.

The large amplitude excitation method is an excellent method since the effects of temperature changes and external perturbations are eliminated. However, it is not so easy to apply an alternating current enough to drive the core into saturation. Accordingly, in prior art the large amplitude excitation method is limited to a magnetic sensor apparatus for detecting a small magnetic field through the use of an amorphous magnetic core and the like having a small saturation field.

For non-contact measurement of a direct current, a method is generally taken to detect a magnetic field generated by a current through the use of a magnetic sensor element. In this method, for example, a magnetic yoke having a gap is provided around a current path, and a magnetic sensor element is placed in the gap. The magnetic field in the gap is measured by the sensor element. Intensity H of the field in the gap is I/g where the current value is I and the gap length is g.

It is assumed that the negative feedback method is applied to a current sensor apparatus in which a fluxgate element made up of a single coil wound around a single magnetic core is used as a magnetic sensor element. Examples in which the negative feedback method is applied to a magnetic sensor apparatus incorporating a fluxgate element are disclosed in Published Unexamined Japanese Patent Application Sho 60-185179 (1985) and Published Unexamined Japanese Patent Application Hei 9-257835 (1997).

In the case where the negative feedback method is applied to the current sensor apparatus incorporating a fluxgate element, a magnetic field generated by the current to be measured is applied to the coil, and the magnetic field generated by the coil through a negative feedback current exactly cancels the applied magnetic field. Therefore, in order to increase the range of current to be measured, it is required to increase the negative feedback current or to reduce the applied field by increasing length g of the gap of the magnetic yoke.

However, an increase in gap g requires a large magnetic yoke, which is uneconomical. An increase in negative feedback current causes an increase in power consumption and leads to unfavorable phenomena such as heating of the coil.

In order to make the field applied to the magnetic sensor element smaller than the field to be measured, a method may be taken to shunt the magnetic flux so that only part of it passes through the magnetic sensor element. However, it is difficult in this method to precisely determine the shunt ratio.

As described so far, in order to increase the measurement range and to measure a large magnetic field or current by the magnetic sensor apparatus or the current sensor apparatus of prior art, it is required to increase the gap of the magnetic yoke or to increase the negative feedback current. In any case the above-mentioned problems are found and it is difficult to achieve the object.

SUMMARY OF THE INVENTION

It is a first object of the invention to provide a magnetic sensor apparatus and a current sensor apparatus for measuring a magnetic field or an electric current having a specific magnitude with accuracy.

It is a second object of the invention to provide a magnetic sensor apparatus, a current sensor apparatus and a magnetic sensor element that easily achieve an increase in a range of magnetic fields or currents to be measured.

It is a third object of the invention to provide a magnetic sensor apparatus, a current sensor apparatus and a magnetic sensor element for easily measuring a large magnetic field or electric current.

A first magnetic sensor apparatus or a first current sensor apparatus of the invention comprises: a magnetic detector for outputting a signal responsive to a magnetic field applied thereto in response to a magnetic field to be measured; a negative feedback means for generating a negative feedback magnetic field used for negative feedback of an output of the magnetic detector to the magnetic detector; and a magnetic substance placed around the magnetic detector or forming part of the magnetic detector and having a demagnetizing factor with respect to the magnetic field to be measured and a demagnetizing factor with respect to the negative feedback magnetic field different from each other.

According to the first magnetic sensor apparatus or current sensor apparatus of the invention, the magnetic substance is placed around the magnetic detector or forms part of the magnetic detector. The magnetic substance has a demagnetizing factor with respect to the magnetic field to be measured and a demagnetizing factor with respect to the negative feedback magnetic field different from each other. As a result, the magnitude of the negative feedback magnetic field is made different from the magnitude of the magnetic field to be measured.

In the first magnetic sensor apparatus or current sensor apparatus, the magnetic substance may be placed around the magnetic detector and have a cavity in which the magnetic detector is placed. The magnetic detector may be placed in the cavity of the magnetic substance.

In the first magnetic sensor apparatus or current sensor apparatus, the magnetic detector may have a magnetic core and a coil wound around the core and provided for detecting the magnetic field to be measured. The magnetic substance may be the magnetic core forming part of the magnetic detector. In the present invention the magnetic core is a core made of a magnetic substance having a magnetic saturation property on which the coil is wound.

A second magnetic sensor apparatus or a second current sensor apparatus of the invention comprises: a magnetic detector for outputting a signal responsive to a magnetic field applied thereto in response to a magnetic field to be measured; and a magnetic substance having a cavity in which the magnetic detector is placed. The magnetic detector is placed in the cavity of the magnetic substance. The ratio between the magnetic field to be measured and the magnetic field applied to the magnetic detector is set at a specific value, based on at least one of a first demagnetizing factor depending on the shape of the magnetic substance and a second demagnetizing factor depending on the shape of the cavity.

According to the second magnetic sensor apparatus or current sensor apparatus of the invention, the ratio between the magnetic field to be measured and the magnetic field applied to the magnetic detector is set at a specific value, based on at least one of the first demagnetizing factor depending on the shape of the magnetic substance and the second demagnetizing factor depending on the shape of the cavity. As a result, the value of the magnetic field applied to the magnetic detector falls within the measurement range of the magnetic detector.

In the second magnetic sensor apparatus or current sensor apparatus, the cavity may have an opening that opens toward a direction intersecting a direction of passage of a magnetic flux generated by the magnetic field to be measured.

In the second magnetic sensor apparatus or current sensor apparatus, the magnetic detector may have a detection sensitivity with a high sensitivity direction and may be placed in the cavity such that the high sensitivity direction coincides with a direction of passage of a magnetic flux generated by the magnetic field to be measured.

The second magnetic sensor apparatus or current sensor apparatus may further comprise a negative feedback field application means for applying a negative feedback magnetic field used for negative feedback of an output of the magnetic detector to the magnetic detector. In this case, the negative feedback field application means may be placed in the cavity such that a demagnetizing factor of the magnetic substance with respect to the magnetic field to be measured is different from a demagnetizing factor of the magnetic substance with respect to the negative feedback magnetic field.

The second magnetic sensor apparatus or current sensor apparatus may further comprise a reference field application means for applying a reference alternating magnetic field to the magnetic detector. The reference field is used for controlling a property of the magnetic detector with respect to the magnetic field to be measured. In this case, the reference field application means may be placed outside the magnetic substance.

A third magnetic sensor apparatus or a third current sensor apparatus of the invention comprises: a fluxgate magnetic sensor element having a magnetic core and a coil wound around the core, the coil being provided for detecting an applied magnetic field to be measured; and a detection means for detecting the magnetic field to be measured by detecting variations in inductance of the coil. The magnetic core has such a shape that a demagnetizing factor thereof with respect to the magnetic field to be measured is different from a demagnetizing factor thereof with respect to a magnetic field generated by the coil.

According to the third magnetic sensor apparatus or current sensor apparatus of the invention, the demagnetizing factor with respect to the magnetic field to be measured is different from the demagnetizing factor with respect to the magnetic field generated by the coil. As a result, when a negative feedback current is supplied to the coil, it is possible to make the current different from the current that would be supplied when the two demagnetizing factors are equal.

In the third magnetic sensor apparatus or current sensor apparatus, the magnetic core may have such a shape that the demagnetizing factor thereof with respect to the magnetic field to be measured is greater than the demagnetizing factor thereof with respect to the magnetic field generated by the coil.

In the third magnetic sensor apparatus or current sensor apparatus, the magnetic core may form an open magnetic circuit with respect to both the magnetic field to be measured and the magnetic field generated by the coil.

In the third magnetic sensor apparatus or current sensor apparatus, the magnetic core may form an open magnetic circuit with respect to the magnetic field to be measured and form a closed magnetic circuit with respect to the magnetic field generated by the coil.

The third magnetic sensor apparatus or current sensor apparatus may further comprise a negative feedback means for having the coil generate a negative feedback magnetic field used for negative feedback of an output of the detection means, by supplying a negative feedback current to the coil. The negative feedback current is used for negative feedback of the output of the detection means.

A fluxgate magnetic sensor element of the invention comprises a magnetic core and a coil wound around the core. The coil is provided for detecting an applied magnetic field to be measured. The magnetic core has such a shape that a demagnetizing factor thereof with respect to the magnetic field to be measured is different from a demagnetizing factor thereof with respect to a magnetic field generated by the coil.

According to the magnetic sensor element of the invention, the demagnetizing factor with respect to the magnetic field to be measured is different from the demagnetizing factor with respect to the magnetic field generated by the coil. As a result, when a negative feedback current is supplied to the coil, it is possible to make the current different from the current that would be supplied when the two demagnetizing factors are equal.

In the magnetic sensor element, the magnetic core may have such a shape that the demagnetizing factor thereof with respect to the magnetic field to be measured is greater than the demagnetizing factor thereof with respect to the magnetic field generated by the coil.

In the magnetic sensor element, the magnetic core may form an open magnetic circuit with respect to both the magnetic field to be measured and the magnetic field generated by the coil.

In the magnetic sensor element, the magnetic core may form an open magnetic circuit with respect to the magnetic field to be measured and form a closed magnetic circuit with respect to the magnetic field generated by the coil.

Other and further objects, features and advantages of the invention will appear more fully from the following description.

BEST MODES FOR CARRYING OUT THE INVENTION

Preferred embodiments of the invention will now be described in detail with reference to the accompanying drawings.

FIRST EMBODIMENT

Figure 1:
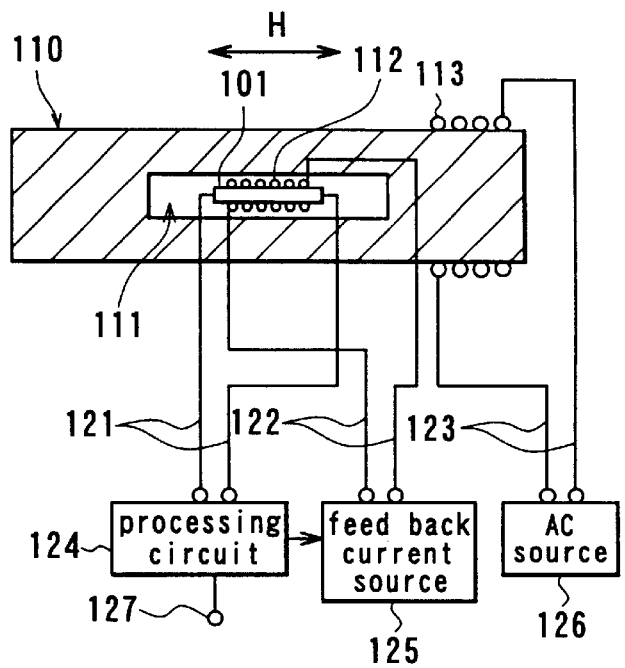
FIG. 1 is an explanatory view illustrating the configuration of a magnetic sensor apparatus of a first embodiment of the invention.

FIG. 1 is an explanatory view for illustrating the configuration of a magnetic sensor apparatus of a first embodiment of the invention.

The magnetic sensor apparatus comprises a magnetic detector 101 that outputs a signal corresponding to a magnetic field and a magnetic substance 110 having a cavity 111 in which the magnetic detector 101 is placed. The magnetic detector 101 is placed in the cavity 111 of the magnetic substance 110. The ratio between magnetic field H to be measured and a magnetic field applied to the magnetic detector 101 is set at a specific value, based on at least one of a first demagnetizing factor depending on the shape of the magnetic substance 110 and a second demagnetizing factor depending on the shape of the cavity 111.

The cavity 111 may have an opening that opens toward a direction intersecting the direction of passage of a magnetic flux generated by magnetic field H, such as toward the direction orthogonal to the direction of passage of the flux. In this case, the opening may be blocked with a magnetic substance other than the magnetic substance 110, if necessary.

The magnetic detector 101 may have a detection sensitivity having a dependence on an angle with respect to the applied magnetic field and having a high sensitivity direction. In this case, it is preferred that the magnetic detector 101 is placed in the cavity 111 such that the high sensitivity direction coincides with the direction of passage of a magnetic flux generated by magnetic field H.

The magnetic sensor apparatus further comprises a feedback coil 112 as a negative feedback field application means (a negative feedback means) that applies a negative feedback magnetic field to the magnetic detector 101. The negative feedback magnetic field is used for negative feedback of an output of the magnetic detector 101. The feedback coil 112 is, for example, placed in the cavity 111 and wound around the detector 101. If the coil 112 is placed in the cavity 111, the demagnetizing factor of the magnetic substance 110 with respect to the magnetic field to be measured is different from the demagnetizing factor thereof with respect to the negative feedback magnetic field. It is not necessary that the coil 112 is applied to the detector 101. Furthermore, it is not necessary that the negative feedback field application means is coil-shaped as the coil 112 as long as the negative feedback field is applied to the detector 101.

The magnetic sensor apparatus further comprises a reference magnetic field coil 113 as a reference field application means for applying a reference alternating magnetic field to the magnetic detector 101. The alternating magnetic field is used for controlling the property of the magnetic detector 101 with regard to magnetic field H to be measured. The coil 113 is, for example, placed outside the magnetic substance 110 and wound around the magnetic substance 110. It is not necessary that the coil 113 is placed directly around the magnetic substance 110 but the coil 113 may be placed in the magnetic path of the field applied to the magnetic substance 110.

The magnetic detector 101 may be chosen from various types of magnetic sensor elements including a Hall element, an MR element, a GMR element such as a spin valve element, and a fluxgate element. If a Hall element is used, some means, such as direct current amplification, are required since an output of the Hall element is small.

Magnetic detector connection lines 121 are connected to both ends of the magnetic detector 101. Feedback coil connection lines 122 are connected to both ends of the feedback coil 112. Reference field coil connection lines 123 are connected to both ends of the reference field coil 113. A processing circuit 124 is connected to the lines 121. The processing circuit 124 processes an output signal of the detector 101 and outputs a signal in response to the magnetic field to be measured to an output terminal 127. A feedback current source 125 for supplying a feedback current to the coil 112 is connected to the lines 122. The feedback current supplied from the source 125 is controlled by the processing circuit 124. An alternating current source 126 for supplying a specific alternating current to the coil 113 is connected to the lines 123.

If the cavity 111 has an opening, the magnetic detector connection lines 121 and the feedback coil connection lines 122 may be drawn from the opening to outside. If the opening is blocked, the lines may be drawn out through the use of known techniques such as forming a conductor pattern in the magnetic substance 110.

The operation of the magnetic sensor apparatus shown in FIG. 1 including the processing circuit 124, the feedback current source 125 and the alternating current source 126 will now be described. A magnetic field having a specific ratio to magnetic field H to be measured as described later is applied to the magnetic detector 101 placed in the cavity 111 of the magnetic substance 110. The processing circuit 124 processes an output signal of the detector 101 and outputs a signal responsive to the magnetic field to be measured to the output terminal 127. The processing circuit 124 controls the feedback current source 125 such that a feedback current responsive to the output signal of the detector 101 is supplied from the feedback current source 125 to the feedback coil 112. In this manner the coil 112 generates a magnetic field in the direction opposite to the direction of the magnetic field applied to the detector 101 in response to the field to be measured. The magnetic field thus generated by the coil 112 has an absolute value equal to that of the field applied to the detector 101. Control is thus performed to keep the magnetic field applied to the detector 101 constantly nearly zero. Inconsistent sensitivity and output variations due to the dependence on temperature of the detector 101 are thereby reduced.

The alternating current source 126 supplies a specific alternating current to the reference field coil 113. An alternating magnetic field is then generated by the coil 113. A reference alternating magnetic field responsive to the alternating magnetic field is superposed on the magnetic field responsive to the field to be measured, and then applied to the detector 101. The processing circuit 124 outputs a signal produced through eliminating reference alternating magnetic field component from the output signal of the detector 101. The processing circuit 124 extracts the reference alternating magnetic field component from the output signal of the detector 101, and adjusts an output signal of the processing circuit 124 such that the magnitude of the reference alternating field component is kept constant. The measurement accuracy of the magnetic sensor apparatus is thereby improved.

The feedback coil 112 and the reference field coil 113 are provided for improving the measurement accuracy of the magnetic sensor apparatus, such as improving linearity or the dependence of output on temperature. Therefore, both or either of the coils 112 and 113 may be eliminated in some cases.

Figure 2:
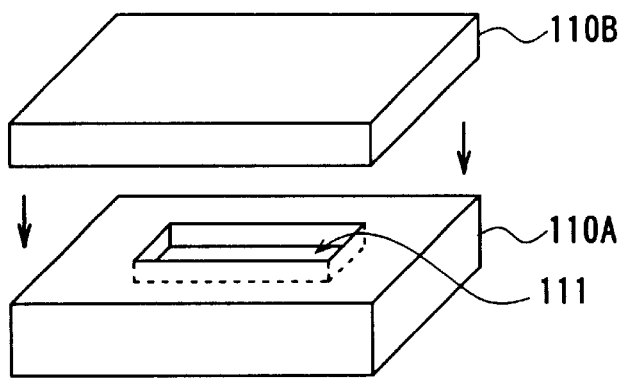
FIG. 2 is a perspective view illustrating an example of a method of forming a cavity in the magnetic substance shown in FIG. 1.

FIG. 2 shows an example of a method of forming the cavity 111 in the magnetic substance 110. In this example a shallow concave recess to be the cavity 111 is formed in one surface of a first magnetic substance 110A having the shape of a rectangular solid, for example. The magnetic detector 101 is placed in the recess, and the recess is then blocked with a second magnetic substance 110B that is plate-shaped, for example. The blocked cavity 111 is thus formed. In this case, the magnetic substance 110 is made up of the first magnetic substance 110A and the second magnetic substance 110B.

Figure 3:
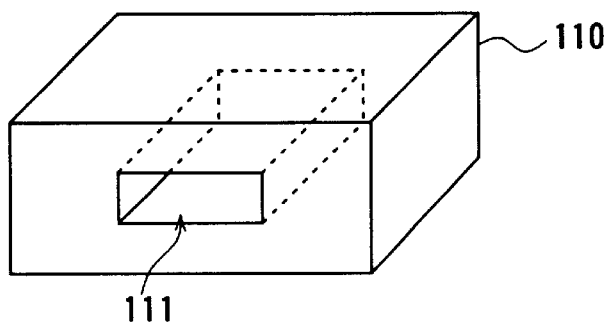
FIG. 3 is a perspective view illustrating another example of a method of forming a cavity in the magnetic substance shown in FIG. 1.

FIG. 3 shows another example of the method of forming the cavity 111 in the magnetic substance 110. In this example the cavity 111 is formed through making an opening having a specific cross-sectional shape in the magnetic substance 110 having the shape of a rectangular solid, for example. The opening opens toward the direction orthogonal to the direction of passage of the magnetic flux generated by the magnetic field to be measured. The magnetic detector 101 is placed in the cavity 111, and the opening of the cavity 111 may be then blocked with another magnetic substance, if necessary.

If ferrite is used for the magnetic substance 110, ferrite powder formed into a desired shape may be baked to make the magnetic substance 110 having the cavity 111. No extra processing costs are required in this case.

The following is a description of one of the features of the magnetic sensor apparatus of this embodiment that the ratio between magnetic field H to be measured and a magnetic field applied to the magnetic detector 101 is set at a specific value, based on at least one of the first demagnetizing factor depending on the shape of the magnetic substance 110 and the second demagnetizing factor depending on the shape of the cavity 111.

At both ends of a magnetic substance placed in a magnetic field, magnetic poles opposite to the direction of the magnetic field are induced. As a result, the field inside the magnetic substance has a value obtained by subtracting the field generated by the induced poles from the external field, which is smaller than the value of the external field. The ratio of the field inside the magnetic substance decreasing with respect to the external field is represented by the factor known as a demagnetizing factor or a self-demagnetizing factor. The demagnetizing factor of a magnetic substance is determined by the shape of the substance only. For example, the demagnetizing factor of a thin and long stick-shaped magnetic substance placed parallel to the external magnetic field is nearly zero. The demagnetizing factor of a thin plate-shaped magnetic substance placed orthogonal to the external field is nearly 1. Consequently, the internal magnetic field of the thin and long stick-shaped magnetic substance placed parallel to the external field is nearly equal to the external field. The internal field of the thin plate-shaped magnetic substance placed orthogonal to the external field is equal to the external field multiplied by one fraction of the relative permeability of the magnetic substance. In the present invention the demagnetizing factor of the magnetic substance depending on the shape of the substance is called the first demagnetizing factor. If the shape of the magnetic substance is suitably designed and the first demagnetizing factor is set at a desired value, the external field is converted to the field inside the magnetic substance through multiplication by a factor in the range between 1 and one fraction of the relative permeability of the magnetic substance.

In contrast, in the cavity of the magnetized magnetic substance, the magnetic field generated by the poles induced by the wall of the cavity has a direction equal to that of the field inside the magnetic substance. Therefore, this field generated by the poles functions such that the field inside the cavity is greater than the field inside the magnetic substance. In the invention the ratio of the field inside the cavity becoming greater than the field inside the magnetic substance is called the demagnetizing factor, too. The demagnetizing factor of the cavity depends on the shape of the cavity. For example, the demagnetizing factor of a thin and long tube-shaped cavity placed parallel to the magnetic field inside the magnetic substance is nearly zero. The demagnetizing factor of a thin slit-shaped cavity placed orthogonal to the field inside the magnetic substance is nearly 1. Consequently, the magnetic field inside the thin and long tube-shaped cavity placed parallel to the field inside the magnetic substance is nearly equal to the field inside the magnetic substance. The magnetic field inside the thin slit-shaped cavity placed orthogonal to the field inside the magnetic substance is equal to the field inside the magnetic substance multiplied by the relative permeability of the magnetic substance. In the invention the demagnetizing factor of the cavity depending on the shape of the cavity is called the second demagnetizing factor. If the shape of the cavity is suitably designed and the second demagnetizing factor is set at a desired value, the field inside the magnetic substance is converted to the field inside the cavity through multiplication by a factor in the range between 1 and the relative permeability of the magnetic substance.

As described so far, the shapes of the magnetic substance 110 and the cavity 111 are appropriately designed, so that the first and second demagnetizing factors are set at desired values. As a result, the ratio between magnetic field H to be measured and the magnetic field applied to the detector 1 is set at a specific value. It is also possible to set one of the first and second demagnetizing factors at a desired value, so that the ratio between magnetic field H and the magnetic field applied to the detector 1 is set at a specific value. However, it is preferred to set both of the first and second demagnetizing factors at appropriate values since the degrees of freedom of design of the shapes of the magnetic substance 110 and the cavity 111 are thereby increased.

The following is a further description specifically illustrating the feature that the ratio between magnetic field H to be measured and a magnetic field applied to the magnetic detector 1 is set at a specific value, based on at least one of the first and second demagnetizing factors.

The relative permeability of the magnetic substance 110 having the cavity 111 is $\mu_s$. The first demagnetizing factor is $N_m$ and the second demagnetizing factor is $N_k$. If the magnetic substance 110 is placed in magnetic field H, magnetic field $H_m$ inside the magnetic substance 110 is represented by equation (1) below.

$$H_m = H/\{1 + N_m(\mu_s - 1)\} \tag{1}$$

If the cavity 111 is sufficiently smaller than the magnetic substance 110, magnetic field $H_k$ inside the cavity 111 is represented by equation (2) below.

$$H_k = H_m\{1 + N_k(\mu_s - 1)\} \tag{1}$$

Consequently, from equations (1) and (2), magnetic field $H_k$ inside the cavity 111 is represented by equation (3) below.

$$H_k = H\{1 + N_k(\mu_s - 1)\} / \{1 + N_m(\mu_s - 1)\} \tag{3}$$

It is noted from equation (3) that if the shapes of the magnetic substance 110 and the cavity 111 are suitably designed so that first demagnetizing factor Nm and second demagnetizing factor $N_k$ are set at desired values, the ratio between magnetic field H to be measured and magnetic field $H_k$ applied to the detector 101 placed in the cavity 111 is set at a specific value. It is thereby possible to measure a high magnetic field exceeding the measurement range of the detector 101 itself, in particular. Measurement of a large electric current is achieved, too, through incorporating this magnetic sensor apparatus into a current sensor apparatus.

In practice, the second demagnetizing factor is more complicated since the magnetic flux distribution inside the magnetic substance 110 is changed due to the presence of the cavity 111. However, since it is no different from representing the nature of the invention, the following description is given, assuming that the above-mentioned equations (1) to (3) hold.

If it is only required to make the magnetic field applied to the magnetic detector 101 smaller than the magnetic field to be measured, a method may be taken to shunt the magnetic flux such that only part of the flux passes through the detector 101. However, this method has problems that leakage flux often results and that the detector 101 is sensitive to the effect of a noise magnetic field. In contrast, this embodiment has advantages much more than those of the method of shunting the flux. That is, the advantages of the embodiment are: it is not necessary to consider leakage flux; the conversion rate of the magnetic field may be set at any value; the detector 101 is magnetically shielded by the magnetic substance 110 and stable against the noise field; and so on.

The effect produced when the cavity 111 has an opening will now be described. Even if the cavity 111 is not completely closed, the second demagnetizing factor is determined by the ratio between the cross-sectional area of the cavity 111 orthogonal to the direction of the magnetic field to be measured and the length of the cavity 111 in the direction of the field to be measured. Therefore, it is possible to form at least one opening, used for placing the detector 101 in the cavity 111, in a direction intersecting the field to be measured or the direction orthogonal to the field, for example. Placing the detector 101 is thus easy performed by forming the opening in such a manner.

The effect produced when the magnetic detector 101 having detection sensitivity with a high sensitivity direction is used will now be described. If the cavity 111 is completely closed, it is natural that the detector 101 be entirely surrounded by the magnetic substance 110 and cut off from the external noise field. The operation thereof is thereby stabilized. If the cavity 111 has an opening, the detector 101 is surrounded by the magnetic substance 110 except the opening, so that the detector 101 is cut off from the external noise field and the operation thereof is stabilized. If the cavity 111 has an opening, the resistance to the noise field is further improved if the detector 101 having detection sensitivity with a high sensitivity direction is used, and detector 101 is placed such that the high sensitivity direction coincides with the direction of passage of the magnetic flux generated by field H to be measured and a low sensitivity direction faces toward the opening of the cavity 111.

The following is a description of the effect produced by the feature that the magnetic sensor apparatus of the embodiment comprises the feedback coil 112 as the negative feedback field application means that applies a negative feedback magnetic field to the magnetic detector 101. The negative feedback magnetic field is used for negative feedback of an output of the detector 101. In prior art it is difficult to apply the negative feedback method very effective for improving linearity or the dependence of output on temperature to a current sensor apparatus for measuring a large direct current. This is because magnetomotive force generated by a feedback current and having a magnitude equal to magnetomotive force generated by a magnetic field to be measured is required.

However, according to the magnetic sensor apparatus of the embodiment, the magnetic field applied to the detector 101 is made smaller than the field to be measured. As a result, the negative feedback field is made smaller than the field to be measured. For example, if the current to be measured is 100 amperes (A) and a gap of 10 mm is formed in the magnetic yoke interlinking the current to be measured, the magnetic field inside the gap is 10000 A/m. If the relative permeability of the yoke is 1000, the magnetic field inside the yoke is 10 A/m, that is, ¹⁄₁₀₀₀ of the field inside the gap, which results from the continuity of the magnetic flux density.

Assuming that the cavity 111 having a demagnetizing factor of $N_k$ is formed in the yoke, the magnetic field inside the cavity 111 is $10 \times (1 + N_k \times 999)$ from equation (2). If $N_k = 0.02$ (which corresponds to the case where the ratio between the diameter of cross section and the length of the cavity 111 is about 10), the field inside the cavity 111 is approximately 210 A/m. Accordingly, the negative feedback method is applicable if a means is provided for the magnetic detector 101 for generating a magnetic field that is enough to cancel the field inside the cavity 111.

It is possible to generate a field of 210 A/m by passing a current of 21 mA through a solenoid coil (10000 turns/m) on which an insulating copper wire having a diameter of 0.1 mm is tightly wound. According to this embodiment, it is thus possible to apply the negative feedback method having a remarkable effect of improving characteristics without requiring a large feedback current. Measurement accuracy is thereby improved.

Although the cavity 111 is directly formed in the magnetic yoke in the foregoing description, it is possible to form the magnetic substance 110 having the cavity 111 besides the yoke, place the detector 101 in the cavity 111, and combine the magnetic substance 110 with the yoke to make a magnetic path.

The following is a description of the effect resulting from the feature that the magnetic sensor apparatus of the embodiment comprises the reference field coil 113 as the reference field application means for applying a reference alternating magnetic field to the magnetic detector 101. The alternating magnetic field is used for controlling the properties of the magnetic detector 101 with regard to magnetic field H to be measured. Although the properties of the detector 101 are substantially improved by applying the above-mentioned negative feedback method, various types of variations that affect the measurement accuracy are not compensated, such as variations in the demagnetizing factor due to variations in dimensions of the cavity 111, or variations in magnetic fields applied to the detector 101 due to variations in dimensions of the gap of the yoke.

However, the alternating current superposing method is applicable since the linearity of the detector 101 is ensured by applying the negative feedback method. For using the alternating current superposing method, for example, the reference field coil 113 is provided on the periphery of the magnetic substance 110 as shown in FIG. 1, or the coil 113 is provided in the magnetic yoke, and a specific alternating current is supplied to the coil 113 to generate an alternating current magnetic field from the coil 113. A reference alternating magnetic field corresponding to this alternating magnetic field is applied to the magnetic detector 101. The processing circuit 124 extracts a reference alternating field component from an output signal of the detector 101 and adjusts an output signal of the processing circuit 124 such that the magnitude of the reference alternating field component is kept constant. It is thereby possible to completely compensate for various types of variations mentioned above that affect the measurement accuracy, such as variations in the demagnetizing factor due to variations in the dimensions of the cavity 111, or variations in magnetic fields applied to the detector 101 due to variations in the dimensions of the gap of the yoke. The measurement accuracy of the magnetic sensor is therefore improved.

The effects of the magnetic sensor apparatus of the embodiment including the foregoing description are summarized as follows.

According to the magnetic sensor apparatus, the ratio between magnetic field H to be measured and the magnetic field applied to the detector 101 is set at a specific value, based on at least one of the first and second demagnetizing factors. It is thereby possible to measure a magnetic field exceeding the measurement range of the detector 101. Measurement of a high magnetic field and a large electric current is achieved, in particular.

According to the magnetic sensor apparatus, the negative feedback method or the alternating current superposing method is easily applied. It is thereby possible to improve the linearity or the dependence of output on temperature if necessary and to improve the measurement accuracy. In addition, no large feedback current is required if the feedback coil 112 as the negative feedback field application means is provided in the cavity 111.

According to the magnetic sensor apparatus, the detector 101 is surrounded by the magnetic substance 110, so that it is cut off from an external noise field and the operation is stabilized.

According to the magnetic sensor apparatus, it is possible that the detector 101 is made up of a magnetic sensor element that is not applicable to prior-art apparatuses since the measurement range thereof is not suitable for magnetic fields to be measured. It is therefore possible to use a magnetic sensor element that is not applicable to prior-art apparatuses with regard to the measurement range although the element ensures the monotonicity of output with respect to variations in field to be measured. If such an element is used, there is no possibility that the negative feedback system would run away although the negative feedback method is applied.

Similarly, according to the magnetic sensor apparatus, it is possible to use a magnetic sensor element that is not applicable to prior-art apparatuses with regard to the measurement range although the element produces a large output. If such an element is used, it is possible to implement a magnetic sensor apparatus that produces a large output and is less affected by drifts.

The magnetic sensor apparatus basically has the configuration in which the detector 101 is placed in the cavity 111 of the magnetic substance 110. It is therefore possible to provide the magnetic sensor apparatus having a simple structure and high accuracy at low costs. In particular, if the cavity 111 having an opening is formed in the magnetic substance 110, it is easy to place the detector 101. It is therefore possible to provide the magnetic sensor apparatus at lower costs. Through application of the alternating current superposing method, it is possible, without mechanical adjustment, to compensate for various types of variations that would affect the measurement accuracy, such as variations in the demagnetizing factor due to variations in the dimensions of the cavity 111, or variations in magnetic fields applied to the detector 101 due to variations in the dimensions of the gap of the yoke. The magnetic sensor apparatus with high accuracy is thereby provided at low costs.

SECOND EMBODIMENT

Figure 4:
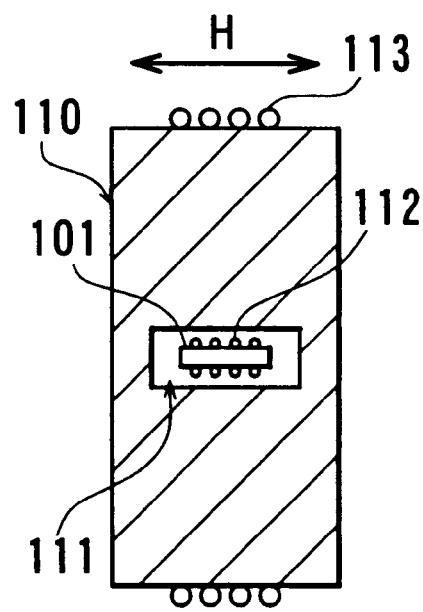
FIG. 4 is a cross-sectional view illustrating the configuration of a magnetic sensor apparatus of a second embodiment of the invention.

A magnetic sensor apparatus of a second embodiment of the invention will now be described with reference to FIG. 4. The magnetic sensor apparatus of this embodiment is designed for high magnetic field measurement. The apparatus comprises the magnetic detector 101 that outputs a signal responsive to a magnetic field and the magnetic substance 110 having the cavity 111 in which the magnetic detector 101 is placed. The magnetic detector 101 is placed in the cavity 111 of the magnetic substance 110. The ratio between magnetic field H to be measured and a magnetic field applied to the magnetic detector 101 is set at a specific value, based on at least one of the first demagnetizing factor depending on the shape of the magnetic substance 110 and the second demagnetizing factor depending on the shape of the cavity 111.

The magnetic sensor apparatus further comprises the feedback coil 112 as the negative feedback field application means that applies a negative feedback magnetic field to the magnetic detector 101. The negative feedback magnetic field is used for negative feedback of an output of the magnetic detector 101. The feedback coil 112 is placed in the cavity 111 and wound around the detector 101.

The magnetic sensor apparatus further comprises the reference field coil 113 as the reference field application means for applying a reference alternating magnetic field to the magnetic detector 101. The alternating magnetic field is used for controlling the property of the magnetic detector 101 with regard to magnetic field H to be measured. The coil 113 is placed outside the magnetic substance 110 and wound around the magnetic substance 110.

For the magnetic sensor apparatus of the embodiment, magnetic field $H_k$ inside the cavity 111 is 0.042 H from equation (3) where relative permeability $\mu_s$ of the magnetic substance 110 is 1000, first demagnetizing factor $N_m$ is 0.5, and second demagnetizing factor $N_k$ is 0.02.

That is, the magnetic field applied to the detector 101 is 4.2 percent of magnetic field H to be measured. In other words, the magnetic sensor apparatus measures a magnetic field approximately 24 times as high as the maximum measurable field of the detector 101.

For the magnetic sensor apparatus, it is enough that the magnetomotive force of the feedback coil 112 is 4.2 percent of the magnetic field to be measured. The magnetomotive force of the reference field coil 113 of about 1 percent of the field to be measured is acceptable. Accordingly, the magnetic sensor apparatus of the embodiment is practical since the current consumption of each of the coils 112 and 113 is very low.

The remainder of configuration, operation and effects of the second embodiment are similar to those of the first embodiment.

THIRD EMBODIMENT

Figure 5:
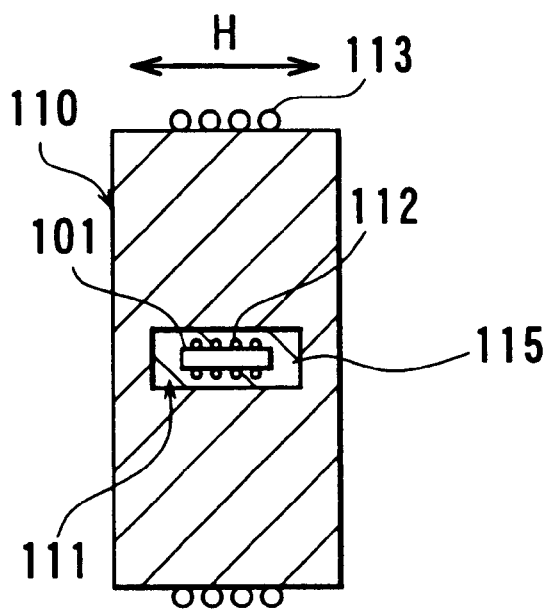
FIG. 5 is a cross-sectional view illustrating an example of the configuration of a magnetic sensor apparatus of a third embodiment of the invention.
Figure 6:
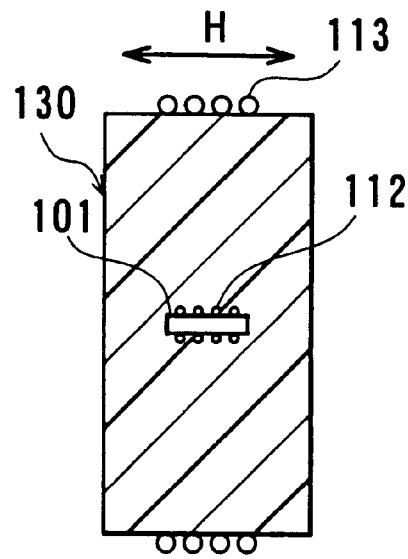
FIG. 6 is a cross-sectional view illustrating another example of the configuration of a magnetic sensor apparatus of the third embodiment.

Reference is now made to FIG. 5 and FIG. 6 to describe a magnetic sensor apparatus of a third embodiment of the invention. The apparatus of this embodiment is an example in which the first demagnetizing factor depending on the shape of the magnetic substance is only set at a desired value, so that the ratio between the magnetic field to be measured and the magnetic field applied to the magnetic detector is set at a specific value.

FIG. 5 is an explanatory view showing an example of the configuration of the magnetic sensor apparatus of the embodiment. In this apparatus the magnetic detector 101 is placed in the cavity 111 of the magnetic sensor apparatus of the second embodiment, and the gap of the cavity 111 is then filled with a magnetic substance 115 such as a magnetic coating material.

In the magnetic sensor apparatus of the third embodiment, the magnetic field inside the magnetic substance 110 is applied to the detector 101. This magnetic field is determined by external magnetic field H and first demagnetizing factor $N_m$ depending on the shape of the magnetic substance 110.

FIG. 6 is an explanatory view showing another example of the configuration of the magnetic sensor apparatus of the embodiment. In this apparatus a single magnetic substance 130 is provided in place of the magnetic substances 110 and 115 of FIG. 5. The detector 101 is embedded inside the magnetic substance 130. The magnetic sensor apparatus having such a configuration is obtained through, for example, forming the magnetic substance 130 having a specific shape and made of a compound material of a resin and a magnetic material while the detector 101 is embedded inside the magnetic substance 130.

The remainder of configuration, operation and effects of the third embodiment are similar to those of the second embodiment.

FOURTH EMBODIMENT

Figure 7:
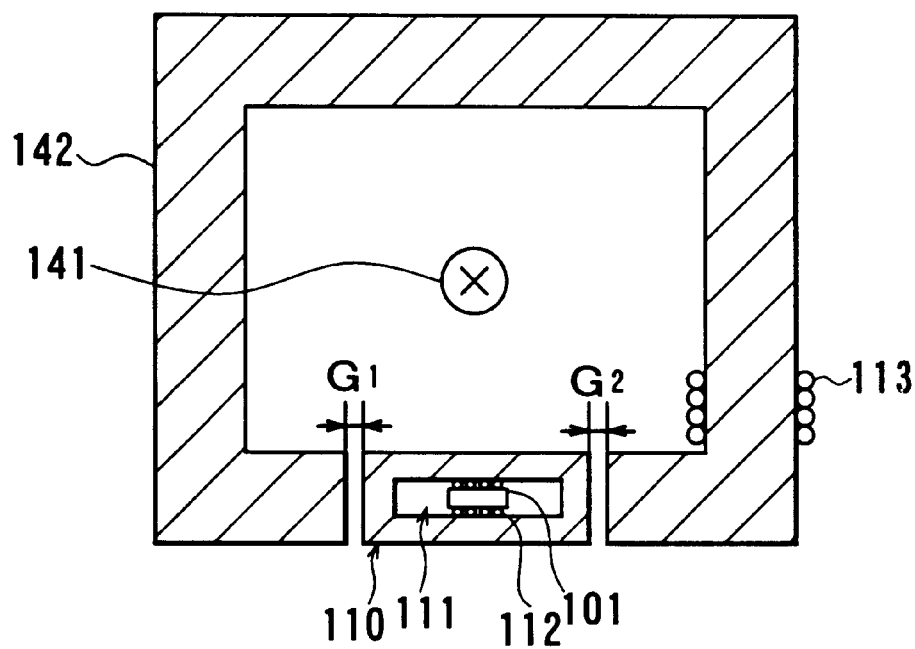
FIG. 7 is a cross-sectional view illustrating the configuration of a magnetic sensor apparatus of a fourth embodiment of the invention.

Reference is now made to FIG. 7 to describe a current sensor apparatus of a fourth embodiment of the invention. This current sensor apparatus incorporates a magnetic sensor apparatus of this embodiment. Although the current sensor apparatus will be mainly described, the following description applies to the magnetic sensor apparatus, too.

The current sensor apparatus of the embodiment comprises: a magnetic yoke 142 that forms a ring a portion of which is cut off and surrounds a conductor 141 through which an electric current-to be measured passes; and the magnetic substance 110 placed in the portion of the yoke 142 cut off. The magnetic substance 110 has the cavity 111 in which the magnetic detector 101 is placed.

According to the current sensor apparatus, the ratio between the magnetic field to be measured generated by the current to be measured and the magnetic field applied to the magnetic detector 101 is set at a specific value, based on at least one of the first demagnetizing factor depending on the shape of the magnetic substance 110 and the second demagnetizing factor depending on the shape of the cavity 111.

The current sensor apparatus further comprises the feedback coil 112 as the negative feedback field application means that applies a negative feedback magnetic field to the magnetic detector 101. The negative feedback magnetic field is used for negative feedback of an output of the magnetic detector 101. The feedback coil 112 is placed in the cavity 111 and wound around the detector 101.

The current sensor apparatus further comprises the reference magnetic field coil 113 as the reference field application means for applying a reference alternating magnetic field to the magnetic detector 101. The alternating field is used for controlling the property of the magnetic detector 101 with regard to the magnetic field to be measured. The coil 113 is wound around part of the magnetic yoke 142.

The length of each of the gaps between ends of the magnetic substance 110 and the yoke 142 is $G_1$ and $G_2$, respectively. The sum of the lengths of the gaps is $G=G_1+G_2$.

The operation of the current sensor apparatus of the embodiment will now be described. In the apparatus, a magnetic field is generated by an electric current to be measured flowing through the conductor 141 in the direction orthogonal to the drawing sheet. This magnetic field is called a magnetic field to be measured in this embodiment. The magnetic field to be measured is applied to the magnetic substance 110. A magnetic field having a specific ratio to the magnetic field to be measured is applied to the magnetic detector 101. The magnitude of the magnetic field to be measured changes in response to the magnitude of the current to be measured. The direction of the magnetic field to be measured changes in response to the direction of the current to be measured, too. The current sensor apparatus indirectly measures the current through measuring the magnetic field generated by the current to be measured. If the apparatus shown in FIG. 7 is used as the magnetic sensor apparatus, the apparatus directly measures the magnetic field.

In the current sensor apparatus of this embodiment, it is unpractical to make the magnetic yoke 142 and the magnetic substance 110 too large-sized. In addition, there is a limit to reducing the size of the cavity 111 since the magnetic detector 101 requires to have certain dimensions. Therefore, it is not always possible to determine the shape of the magnetic substance 110 as desired and to determine first demagnetizing factor $N_m$ as desired.

However, even though first demagnetizing factor $N_m$ depending on the shape of the magnetic substance 110 is small, the yoke 142 and the magnetic substance 110 nearly forms a closed magnetic circuit with gaps $G_1$ and $G_2$. If leakage flux is ignored, the magnetic field inside the magnetic substance 110 is one fraction of the relative permeability of the magnetic substance 110 if the relative permeability of the magnetic substance 110 is sufficiently greater than 1. This is equal to the fact that first demagnetizing factor $N_m$ is 1.

Where the relative permeability of the magnetic substance 110 is $\mu_{sm}$ and the relative permeability of the magnetic yoke 142 is $\mu_{sy}$, the relation holds that $\mu_{sm} \gg 1$ and $\mu_{sy} \gg 1$. Where the magnetic field inside the magnetic substance 110 is $H_m$ and the magnetic field in the gap having a length of G is $H_g$, the relation holds that $H_g=1/G$ and $H_m=H_g/\mu_{sm}$. Therefore, field $H_k$ inside the cavity 111 is expressed by the following equation.

$$H_k=(1/G\mu_{sm})\{1+N_k(\mu_{sm}-1)\}$$

Field $H_k$ inside the cavity 111 is obtained as follows where the current to be measured is 100 A, the total gap length G, that is, $G_1+G_2$ is 10 mm, second demagnetizing factor $N_k$ is 0.02 (which corresponds to the case where the ratio between the diameter of the cross section and the length of the cavity 111 is about 10), and $\mu_{sm}$ is 1000.

$$H_k=209.8 \approx 210 \, A/m.$$

Therefore, as the magnetic detector 101, it is possible to use a highly sensitive magnetic sensor element such as a spin-valve-type GMR element or a fluxgate element. Such a highly sensitive magnetic sensor element exhibits a high signal-to-noise (S-N) ratio of output and stable operation when the magnetic sensor element operates in the neighborhood of the magnetic field of zero as in the case where the negative feedback method is applied. Since many of spin-valve-type GMR elements and fluxgate elements ensure the monotonicity of output of the elements, there is no possibility that the feedback system would run away if such an element is used.

If magnetic field $H_k$ inside the cavity 111 is 210 A/m, a negative feedback magnetic field of 210 A/m is required. It is possible to generate a field of 210 A/m by passing a current as small as 21 mA through a solenoid coil (100 turns/cm) on which an insulating copper wire having a diameter of 0.1 mm is tightly wound. The current required for the reference field coil 113 is 10 mA which is 1 percent of magnetomotive force of 100 A/m generated by the current to be measured where the number of turns of the coil is 100. According to the embodiment as thus described, it is possible to implement the current sensor apparatus with accuracy, stability, and the ability of reducing variations and so on that are equal to those of prior-art apparatuses, through the use of a smaller feedback current and a smaller alternating current for alternating current superimposing, compared to the prior-art apparatuses that require a large feedback current when the negative feedback method is used.

The remainder of configuration, operation and effects of the fourth embodiment are similar to those of the first embodiment.

FIFTH EMBODIMENT

Figure 8:
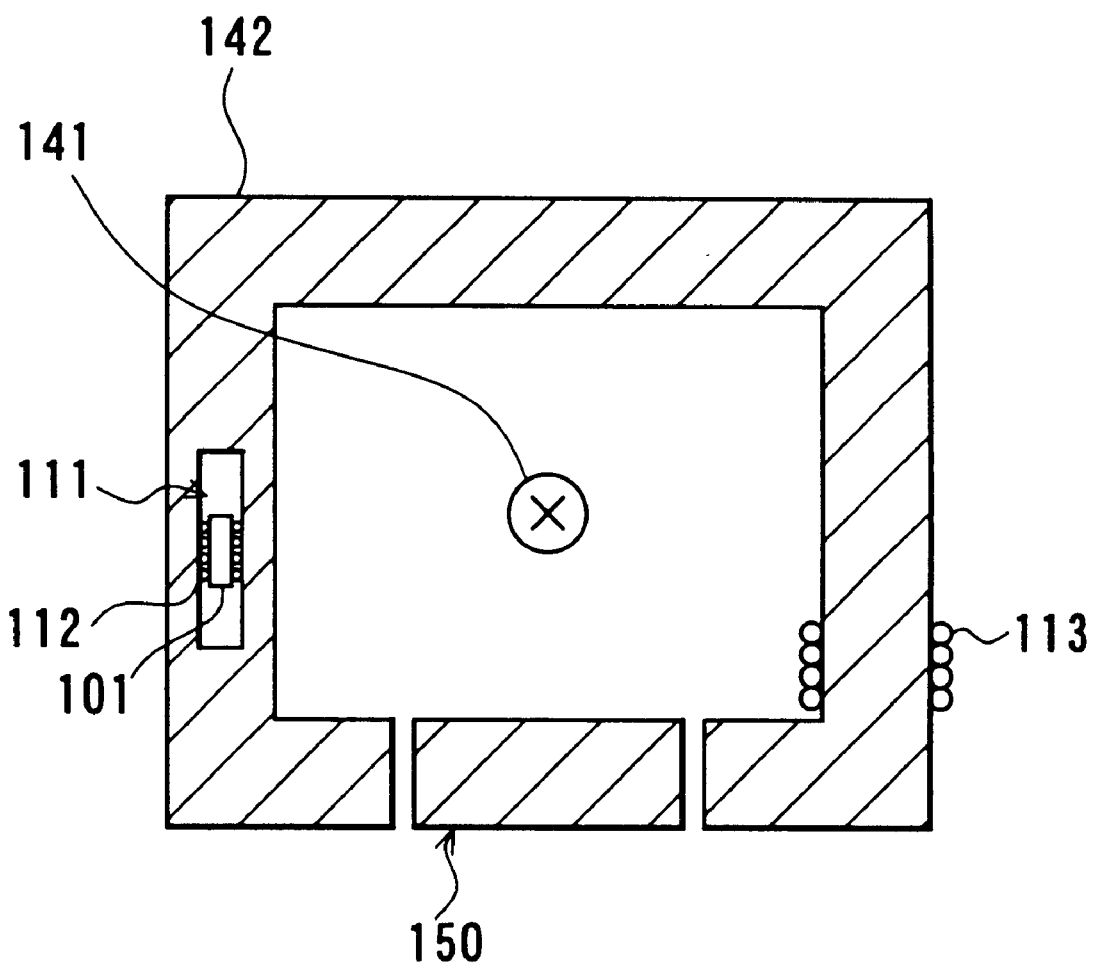
FIG. 8 is a cross-sectional view illustrating the configuration of a magnetic sensor apparatus of a fifth embodiment of the invention.

Reference is now made to FIG. 8 to describe a current sensor apparatus of a fifth embodiment of the invention. The apparatus of this embodiment is an example in which the second demagnetizing factor depending on the shape of the cavity in the magnetic substance is only set at a desired value, so that the ratio between the magnetic field to be measured and the magnetic field applied to the magnetic detector is set at a specific value.

In the current sensor apparatus of this embodiment, the magnetic substance 110 of the current sensor apparatus shown in FIG. 7 is replaced with a magnetic substance 150 that does not have a cavity and a magnetic detector inside. In this apparatus the cavity 111 is formed inside the magnetic yoke 142 of the current sensor apparatus shown in FIG. 7. The magnetic detector 101 is placed in the cavity 111. The yoke 142 corresponds to a magnetic substance having a cavity of the invention.

In the current sensor apparatus the magnetic field inside the cavity 111 is applied to the detector 101. This magnetic field is determined by the magnetic field to be measured corresponding to the current to be measured and second demagnetizing factor $N_k$ depending on the shape of the cavity 111.

The remainder of configuration, operation and effects of the fifth embodiment are similar to those of the fourth embodiment.

According to the magnetic sensor apparatus or the current sensor apparatus of the invention including the first to fifth embodiments, the ratio between the magnetic field to be measured and the magnetic field applied to the magnetic detector is set at a specific value, based on at least one of the first demagnetizing factor depending on the shape of the magnetic substance and the second demagnetizing factor depending on the shape of the cavity. It is thereby possible that the magnetic field applied to the magnetic detector falls within the measurement range of the magnetic detector. As a result, it is easy to use the magnetic detector having excellent properties and techniques for improving measurement accuracy. It is thus possible to measure a magnetic field or an electric current having a specific magnitude with accuracy. Furthermore, the magnetic detector is magnetically shielded by the magnetic substance, so that it is stable against a noise field.

The cavity may have an opening that opens toward the direction intersecting the direction of passage of the magnetic flux generated by the magnetic field to be measured. In this case, it is easy to place the magnetic detector in the cavity.

The magnetic detector may have detection sensitivity with a high sensitivity direction, and the detector may be placed such that the high sensitivity direction coincides with the direction of passage of the magnetic flux generated by the magnetic field to be measured. In this case the resistance to a noise field is further improved.

The magnetic sensor apparatus or the current sensor apparatus may comprise the negative feedback field application means that applies a negative feedback magnetic field to the magnetic detector. The negative feedback magnetic field is used for negative feedback of an output of the magnetic detector. In this case, it is possible to improve the linearity and the dependence of output on temperature and to improve the measurement accuracy.

If the negative feedback field application means is placed in the cavity, it is further possible to reduce the feedback current even when a high magnetic field or a large electric current is measured.

The magnetic sensor apparatus or current sensor apparatus may comprise the reference field application means for applying a reference alternating magnetic field to the magnetic detector. The alternating magnetic field is used for controlling the property of the magnetic detector with regard to the magnetic field to be measured. In this case, it is possible to compensate for various types of variations that would affect the measurement accuracy.

SUMMARY OF SIXTH TO EIGHTH EMBODIMENT

A summary of sixth to eighth embodiments of the invention will now be described. In those embodiments a fluxgate magnetic sensor element comprises a magnetic core and a coil wound around the core and detecting an applied magnetic field to be measured. The magnetic core has a shape that makes the demagnetizing factor with respect to the magnetic field to be measured different from the demagnetizing factor with respect to the magnetic field generated by the coil. In those embodiments, in particular, the magnetic core has a shape that makes the demagnetizing factor with respect to the magnetic field to be measured greater than the demagnetizing factor with respect to the magnetic field generated by the coil.

The demagnetizing factor of the magnetic core with respect to the applied magnetic field to be measured and the demagnetizing factor of the core with respect to the magnetic field generated by the coil will now be considered.

Magnetic field $H_s$ inside a magnetic substance placed in parallel magnetic field $H_g$ is expressed by equation (4) below.

$$H_s = H_g / \{1 + N_s(\mu_s - 1)\} \tag{4}$$

The demagnetizing factor is represented by $N_s$ and the relative permeability of the magnetic substance is represented by $\mu_s$. The demagnetizing factor will now be briefly described. At both ends of a magnetic substance placed in a magnetic field, magnetic poles in the direction opposite to the direction of the magnetic field are induced. Consequently, the magnetic field inside the magnetic substance is equal to the value of the external magnetic field from which the magnetic field generated by the induced poles is subtracted, which is smaller than the external field. The ratio of the field inside the magnetic substance becoming smaller than the external field is expressed by a factor known as a demagnetizing factor or self-demagnetizing factor. The demagnetizing factor of a magnetic substance is determined only by the shape of the substance.

Where a magnetic field to be measured or a magnetic field generated by a current to be measured is represented by $H_g$, demagnetizing factor $N_s$ of a rod-like magnetic core with respect to $H_g$ is equal to demagnetizing factor $N_c$ with respect to the magnetic field generated by the coil wound around the core (which approximates to a parallel magnetic field for convenience). Therefore, if the negative feedback method is applied, a magnetic field generated by the coil through the use of a negative feedback current is required to be $-H_g$. Assuming that 'n' turns of coil is wound around width 'b' (meters) of the rod-like core, a simple approximation holds that the magnetic field generated is ni/b where the coil current is 'i'. Magnetic field $H_c$ inside the core is expressed by equation (5) below.

$$H_c = (ni/b)/\{1 + N_c(\mu_s - 1)\} \quad (5)$$

If the negative feedback method is applied, the relation holds that $H_g = -H_c$. Therefore, equation (6) below is obtained where $N_s = N_c$.

$$H_g = -ni/b \quad (6)$$

Therefore, where the relation holds that $N_s = N_c$, it is required to reduce the width of the coil turns (the coil length in the axial direction) 'b' or to increase the number of turns 'n', in order to reduce negative feedback current 'i' without changing gap length 'g' of the magnetic yoke, that is, without changing $H_g$, or on the contrary, in order to increase $H_g$ without increasing negative feedback current 'i'. However, there is a limit in either case, such as a problem of wire required to be too thin.

If demagnetizing factor $N_s$ of the magnetic core with respect to field $H_g$ to be measured is different from demagnetizing factor $N_c$ of the core with respect to the magnetic field generated by the coil wound around the core (which approximates to a parallel magnetic field for convenience) where $N_s > N_c$, the relation holds that $H_c > H_g$ from equations (4) and (5). It is thereby noted that the magnetic field to be measured or the current to be measured is increased without changing the other conditions.

The demagnetizing factor depends on the cross-sectional area of the magnetic substance orthogonal to the direction of passage of the magnetic flux and the length of the magnetic substance along the direction of passage of the flux. Therefore, in order to make $N_s$ greater than $N_c$, the apparent length of the magnetic core with respect to the magnetic flux of the applied field may be made different from the apparent length of the core with respect to the magnetic flux of the field generated by the coil. A simple example of implementing this is to provide a U-shaped magnetic core having a straight rod-like bottom portion and portions extending from ends of the bottom portion in the direction orthogonal to the orientation of the bottom portion. A coil is wound around the bottom portion and a magnetic field to be measured is applied in the axial direction of the bottom portion.

Although a well-known fluxgate element incorporating a toroidal core has the demagnetizing factor of zero with respect to an excitation magnetic field, the configuration, objective, and effects of this fluxgate element are different from those of the magnetic sensor element of the present invention. The operation principle of the former fluxgate element is as follows. An annular path is provided for the excitation magnetic flux in the toroidal core. As a result, the magnetic flux generated by the external magnetic field applied to the excitation flux in the toroidal core in parallel is added in part of the annular path and subtracted in another part of the annular path. Consequently, the magnetic flux is large in some portions and small in other portions inside the toroidal core. If the core is driven into saturation where the flux is increased through addition of the flux generated by the external field, the excitation flux leaks out of the core. If the excitation flux is constant, the magnitude of the leakage flux depends on the magnitude of the external field. Therefore, the entire toroidal core including the excitation winding is inserted to another coil, and this coil detects the leakage flux so as to detect the external field. In the magnetic sensor element of the invention, in contrast, the coil wound around the magnetic core functions as the coil for detecting the external field and detects the external field by detecting variations in inductance of the coil. A coil for detecting leakage flux is therefore not required. Furthermore, no consideration is given to the fluxgate element incorporating the toroidal core with regard to the shape affecting the demagnetizing factor with respect to the external field.

SIXTH EMBODIMENT

Figure 9:
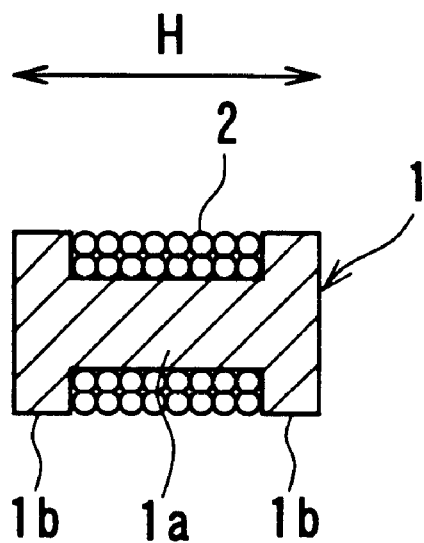
FIG. 9 is a cross-sectional view illustrating the configuration of a magnetic sensor apparatus of a sixth embodiment of the invention.

A magnetic sensor element of a sixth embodiment of the invention will now be described. FIG. 9 is a cross-sectional view showing the configuration of the magnetic sensor element of the embodiment. The element is a fluxgate magnetic sensor element comprising a magnetic core 1 and a coil 2 wound around the core 1 and detecting an applied magnetic field to be measured. The magnetic core 1 corresponds to a magnetic substance of the invention.

The magnetic core 1 is a drum-shaped core having a cylindrical core portion 1a and disk-shaped brim portions 1b formed at both ends of the core portion 1a. The magnetic core 1 forms an open magnetic circuit both for the magnetic field to be measured and for the magnetic field generated by the coil 2. For example, the core portion 1a may have a diameter of 0.8 mm and a length of 1.5 mm and each of the brim portions 1b may have a diameter of 2 mm and a thickness of 0.5 mm. The core 1 may be made of Ni—Cu—Zn—base ferrite and have relative permeability $\mu_s$ of 500, for example.

The coil 2 is wound around core portion 1a of the magnetic core 1. For example, the coil 2 may be made of 180 turns of urethane-coated wire having a diameter of 0.03 mm.

The inductance of the magnetic sensor element shown in FIG. 9 is 350 $\mu$H. The coil current that reduces the inductance to the half is 60 mA.

The operation of the magnetic sensor element of the embodiment will now be described. This element is incorporated into a magnetic sensor apparatus or a current sensor apparatus. To be specific, the element is placed such that the axial direction of the core portion 1a is parallel to the magnetic field to be measured indicated with H in FIG. 9 (including the magnetic field to be measured generated by the current to be measured). For example, if the large amplitude excitation method is used, an alternating current that drives the core 1 into a saturation region at a peak is applied to the coil 2. If the negative feedback method is used, a negative feedback current for generating an inverse magnetic field having a magnitude equal to the magnitude of the field to be measured is supplied to the coil 2.

It is difficult to analytically obtain demagnetizing factor $N_s$ of the core 1 with respect to external field H when external field H to be measured is applied to the magnetic sensor element of this embodiment and demagnetizing factor $N_c$ with respect to the magnetic field generated by the coil 2 wound around the coil 2. However, it is possible to estimate these factors based on measured values as follows.

In the magnetic sensor element shown in FIG. 9, the coil current that makes the magnetic field inside the coil 2 zero which is obtained through actual measurement is 5 mA for H=1000 AT/m. Assuming that demagnetizing factors $N_s$ and $N_c$ are equal, coil current 'i' that makes the magnetic field inside the coil 2 zero is approximately obtained through equation (6) as follows.

Since $H=(180 \times i/1.5) \times 1000$, $i=8.3$ mA where $H=1000$ AT/m

The measured value of coil current that makes the magnetic field inside the coil 2 zero is about 1/1.6 of the coil current value where demagnetizing factors $N_s$ and $N_c$ are equal. Therefore, it will be noted that the equivalent demagnetizing factor obtained from the ratio of the current value is $N_s \approx 1.6 N_c$. That is, according to the magnetic sensor element of the embodiment, the negative feedback current for canceling the same external magnetic field (the magnetic field to be measured) is reduced to 1/1.6 of the current required where demagnetizing factors $N_s$ and $N_c$ are equal.

The reason that equivalent demagnetizing factor $N_s$ is not much greater than demagnetizing factor $N_c$ is as follows. Attention being given to the length of the magnetic path on the center line of the magnetic core 1, demagnetizing factor $N_s$ of the core 1 with respect to the magnetic field to be measured is, broadly speaking, equivalent to the demagnetizing factor of a magnetic core having a diameter of 0.8 mm and a length of 2.5 mm. Similarly, demagnetizing factor $N_c$ of the core 1 with respect to the magnetic field generated by the coil 2 is equivalent to the demagnetizing factor of a magnetic core having a diameter of 0.8 mm and a length of 4 mm. Therefore, the ratio between the magnetic path lengths is not so great.

According to the magnetic sensor element of the embodiment thus described, demagnetizing factor $N_s$ of the core 1 with respect to the applied magnetic field to be measured is different from demagnetizing factor $N_c$ of the core 1 with respect to the magnetic field generated by the coil 2. As a result, when a negative feedback current is supplied to the coil 2, it is possible to make the current different from the current supplied when demagnetizing factors $N_s$ and $N_c$ are equal. It is therefore easy to increase the measurement range of magnetic fields or electric currents. According to this embodiment, in particular, demagnetizing factor $N_s$ of the core 1 with respect to the applied magnetic field to be measured is greater than demagnetizing factor $N_c$ of the core 1 with respect to the magnetic field generated by the coil 2. As a result, when a negative feedback current is supplied to the coil 2, it is possible to make the current smaller than the current supplied when demagnetizing factors $N_s$ and $N_c$ are equal. It is therefore easy to measure a large magnetic field or electric current.

SEVENTH EMBODIMENT

Figure 10:
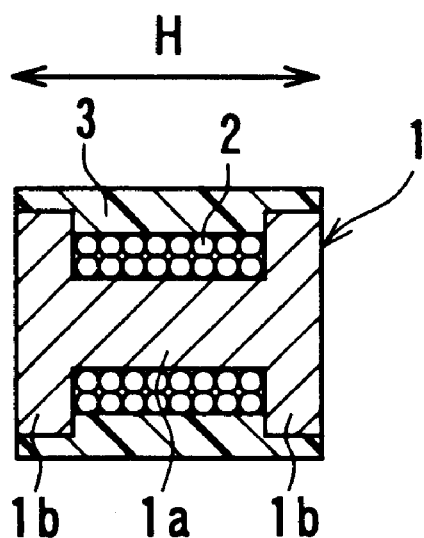
FIG. 10 is a cross-sectional view illustrating the configuration of a magnetic sensor apparatus of a seventh embodiment of the invention.

A magnetic sensor element of a seventh embodiment of the invention will now be described. FIG. 10 is a cross-sectional view showing the configuration of the magnetic sensor element of the embodiment. The element comprises the magnetic core 1 and the coil 2 similar to those of the magnetic sensor element of the sixth embodiment. In addition, the exterior of the coil 2 is coated with a magnetic coating material made of a mixture of ferrite powder and a resin coating material to form a coating layer 3. The coating layer 3 connects the two brim portions 1b of the core 1 to each other.

For example, the average thickness of the coating layer 3 may be 0.5 mm. The relative permeability of the coating layer 3 may be 12. The inductance of the coil 2 of the magnetic sensor element of this embodiment is 1 mH. The coil current that reduces the inductance to the half is 30 mA.

In this embodiment, assuming that the core 1 and the coating layer 3 make up the magnetic core, this magnetic core forms an open magnetic circuit with respect to the magnetic field to be measured but forms a closed magnetic circuit with respect to the magnetic field generated by the coil 2. Consequently, demagnetizing factor $N_c$ of the core with respect to the magnetic field generated by the coil 2 is greatly reduced. In this case, the coil current that makes the magnetic field inside the coil 2 zero which is obtained through actual measurement is 2.4 mA for H=1000 AT/m. Accordingly, the equivalent demagnetizing factor is $N_s \approx 3.5 N_c$. That is, according to the embodiment, the negative feedback current required is reduced to 1/3 or less of the current required where demagnetizing factors $N_s$ and $N_c$ are equal.

The remainder of configuration, operation and effects of the embodiment are similar to those of the sixth embodiment.

EIGHTH EMBODIMENT

Figure 11:
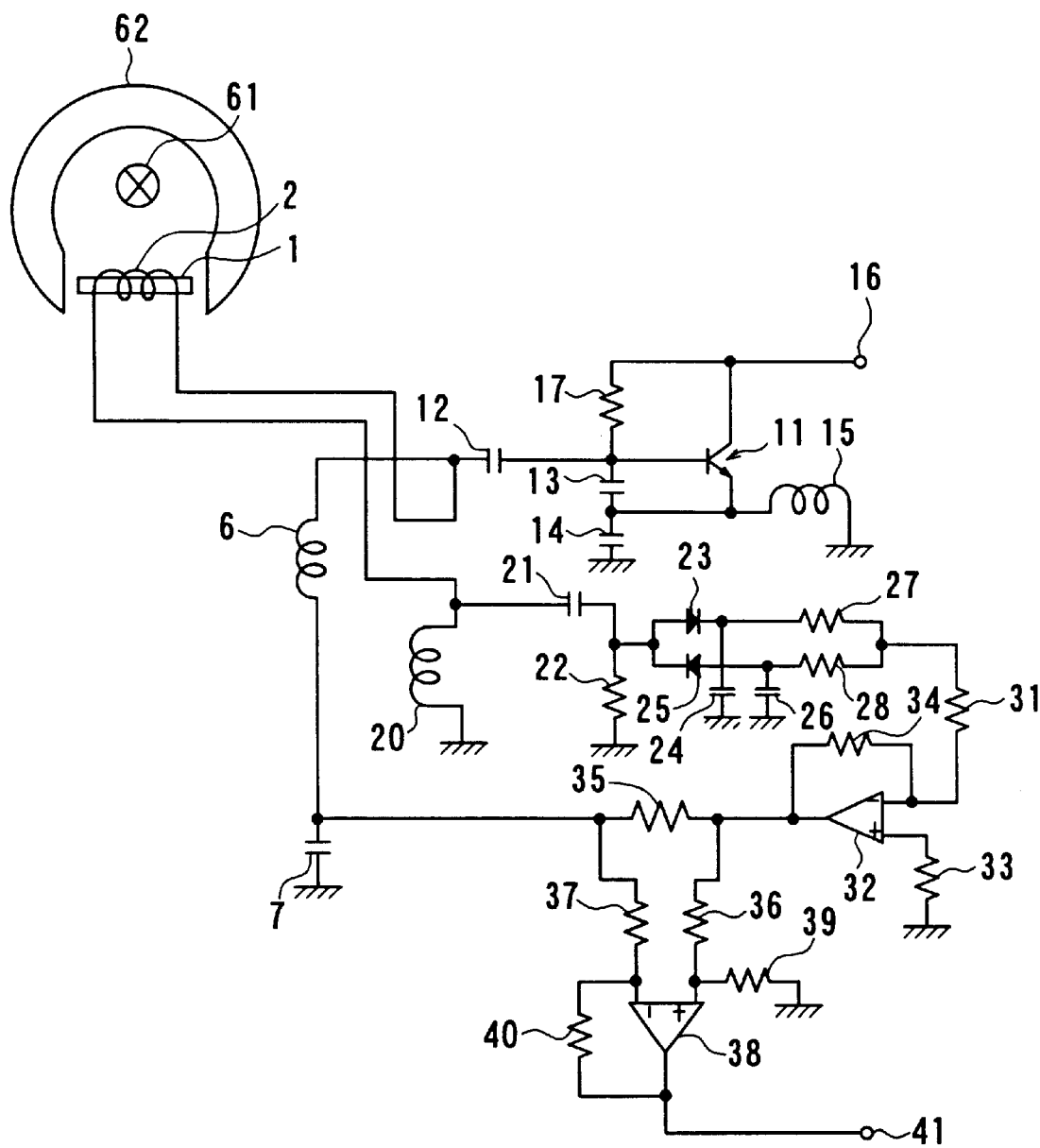
FIG. 11 is a circuit diagram illustrating the configuration of a current sensor apparatus of an eighth embodiment of the invention.

A current sensor apparatus of an eighth embodiment of the invention will now be described. FIG. 11 is a circuit diagram of the current sensor apparatus of the embodiment. The current sensor apparatus incorporates the magnetic sensor element of the sixth embodiment. The current sensor apparatus includes a magnetic sensor apparatus of the eighth embodiment.

The current sensor apparatus comprises a magnetic yoke 62 that surrounds a conductor 61 through which a current to be measured flows. Part of the yoke 62 has a gap in which the magnetic sensor element of the sixth embodiment is placed. The magnetic sensor apparatus is the part of the current sensor apparatus shown in FIG. 11 except the magnetic yoke 62.

The circuit configuration of the current sensor apparatus of the embodiment will now be described. Positive and negative power supply circuits for an operational amplifier are not shown, according to the practice.

An end of a detection coil 20 is connected to an end of the coil 2. The other end of the detection coil 20 is grounded. An end of a coil 6 used for a feedback current path is connected to the other end of the coil 2. The other end of the coil 6 is grounded through a capacitor 7.

The current sensor apparatus further comprises: a drive circuit having a series resonant circuit part of which is made up of the coil 2 and supplying a resonant current flowing through the series resonant circuit, as an alternating current for driving the core 1 into a saturation region, to the coil 2;

and a detection and feedback circuit for detecting a magnetic field to be measured by detecting variations in resonant current flowing through the coil 2 that corresponds to inductance variations of the coil 2 and for supplying a feedback current used for the negative feedback method to the coil 2 so as to have the coil 2 generate a negative feedback magnetic field used for the negative feedback method. The detection and feedback circuit corresponds to a negative feedback means of the invention.

The drive circuit has an oscillation circuit including the series resonant circuit. The configuration of the oscillation circuit is as follows. The oscillation circuit incorporates a transistor 11. The base of the transistor 11 is connected to the other end of the coil 2 through a capacitor 12 used for resonance. An end of a capacitor 13 used for feedback is connected to the base of the transistor 11. An end of the capacitor 14 used for feedback and the emitter of the transistor 11 are connected to the other end of the capacitor 13. The other end of the capacitor 14 is grounded. The emitter of the transistor 11 is grounded through a load coil 15. The collector of the transistor 11 is connected to a power input 16 and to the base through a bias resistor 17. The configuration of this oscillation circuit is that of a Clapp oscillation circuit wherein Cs<<Cb and Cs<<Ce, the capacitance of each of the capacitors 12, 13 and 14 being Cs, Cb and Ce, respectively.

The configuration of the detection and feedback circuit is as follows. An end of a capacitor 21 is connected to the connection point between the coil 2 and the detection coil 20. The other end of the capacitor 21 is grounded through a resistor 22. The capacitor 21 and the resistor 22 make up a differentiation circuit for differentiating the voltage generated across the coil 20 and outputting a signal corresponding to the magnetic field to be measured.

The anode of a diode 23 and the cathode of a diode 25 are connected to the connection point between the capacitor 21 and the resistor 22. The cathode of the diode 23 is grounded through a capacitor 24. The anode of the diode 25 is grounded though a capacitor 26. The diode 23 and the capacitor 24 make up the positive peak hold circuit. The diode 25 and the capacitor 26 make up the negative peak hold circuit.

An end of a resistor 27 is connected to the connection point between the diode 23 and the capacitor 24. An end of a resistor 28 is connected to the connection point between the diode 25 and the capacitor 26. The other end of each of the resistors 27 and 28 is connected to an end of a resistor 31. The resistors 27 and 28 make up the resistor adding circuit for adding a positive output value held at the positive peak hold circuit to a negative output value held at the negative peak hold circuit. A detection signal corresponding to the external magnetic field is present at an end of the resistor 31.

The other end of the resistor 31 is connected to the inverting input of an operational amplifier 32. The noninverting input of the operational amplifier 32 is grounded through a resistor 33. The output of the operational amplifier 32 is connected to the noninverting input through a resistor 34. The amplifier 32 and the resistors 31, 33 and 34 make up an inverting amplifier.

The output of the operational amplifier 32 is connected to an end of a resistor 35 for detecting an output. The other end of the resistor 35 is connected to the connection point between the coil 6 and a capacitor 7. The one end of the resistor 35 is connected to the noninverting input of an operational amplifier 38 through a resistor 36. The other end of the resistor 35 is connected to the inverting input of the amplifier 38. The noninverting input of the amplifier 38 is grounded through a resistor 39. The output of the amplifier 38 is connected to the inverting input through a resistor 40 and to an detection output 41. The amplifier 38 and the resistors 36, 37, 39 and 40 make up a differential amplifier.

The detection coil 20, the coil 6 and the capacitor 7 are not only part of the oscillation circuit as the drive circuit but also part of the detection and feedback circuit.

The operation of the current sensor apparatus of the embodiment will now be described. An alternating current is supplied to the coil 2 by the oscillation circuit such that the core 1 is driven into the saturation region. The alternating current is a resonant current that is equal to the current value limited by the supply voltage multiplied by value Q of the resonant circuit. A method taken in this embodiment is to detect variations in waveform of resonant current as a method of capturing variations in inductance of the coil 2 as an output signal of the magnetic current apparatus. To be specific, the voltage across the detection coil 20 connected to the coil 2 in series and having a large saturation current is differentiated at the differentiation circuit made up of the capacitor 21 and the resistor 22. A positive output value of an output of the differentiation circuit is held at the positive peak hold circuit made up of the diode 23 and the capacitor 24. A negative output value of the output of the differentiation circuit is held at the negative peak hold circuit made up of the diode 25 and the capacitor 26. The positive and negative output values are added to each other at the resistor adding circuit made up of the resistors 27 and 28. A detection signal corresponding to the external magnetic field is thus obtained.

When no external magnetic field is present, the positive and negative portions of the differential waveform of the voltage across the detection coil 20 are symmetric, and the sum of positive and negative peak values (the difference between the absolute values) of the differential waveform is zero. In contrast, when the external field is applied to the coil 2, the positive and negative portions of the differential waveform are asymmetric. As a result, the sum of positive and negative peak values (the difference between the absolute values) of the differential waveform is other than zero, which depends on the external magnetic field. According to the embodiment, in such a manner, the external magnetic field is measured by obtaining the sum of positive and negative peak values (the difference between the absolute values) of the differential waveform.

As thus described, the detection and feedback circuit detects the magnetic field to be measured, based on a portion of the resonant current flowing through the coil 2 that drives the core 1 into the saturation region. In other words, the detection and feedback circuit 4 detects the magnetic field to be measured, based on asymmetric positive and negative components of the resonant current flowing through the coil 2.

The detection signal obtained at the adding circuit made up of the resistors 27 and 28 is inverted and amplified at the inverting amplifier made up of the operational amplifier 32 and the resistors 31, 33 and 34. The signal is then carried through the resistor 35 and applied to the connection point between the coil 6 and the capacitor 7. A negative feedback current is thereby supplied to the coil 2 through the coil 6 and magnetomotive force in the direction opposite to the external magnetic field is applied to the coil 2. In this embodiment, since the inverting amplifier has outputs of both positive and negative polarities, negative and positive feedback currents (wherein one of the directions of the external field is defined as positive) corresponding to the positive and negative polarities of the external magnetic field are supplied from the output of the inverting amplifier to the coil 2. Therefore, the end of the inverting amplifier on the side of the coil 2 is grounded.

The external magnetic field is measured as follows. The feedback current, that is, the current corresponding to the external field, is converted to a voltage by the resistor 35. The voltage is amplified at the differential amplifier made up of the operational amplifier 38 and the resistors 35, 36, 39 and 40, and then given to the detection output 41. A detection output signal corresponding to the external field is then outputted from the detection output 41.

The balance between the external field and the magnetomotive force generated by the negative feedback current would not change unless the ampere turn of the coil 2 changes. Consequently, the current sensor apparatus of the embodiment achieves reduced sensitivity variations, excellent linearity, and excellent stability against changes in temperature, supply voltage and so on. In addition, since the large amplitude excitation method is taken, the offset is zero, according to the principle, and no drift due to external perturbations occurs.

A specific example of the current sensor apparatus actually fabricated will now be described. In this example, the yoke 62 is a toroidal core made of Mn—Zn—base ferrite. The yoke 62 has an outer diameter of 20 mm, an inner diameter of 10 mm and a thickness of 5 mm and has a gap of 8 mm in width. In this example the dimensions of the entire apparatus are 20 mm by 35 mm by 6 mm and very small. The apparatus is operated at a power source of ±5 V. Current consumption is +27 mA and −2 mA when the current to be measured is zero. In the apparatus an increase in current consumption due to a negative feedback current is 5 mA per current to be measured of 10 A. The weight of the apparatus is 10 g.

Figure 12:
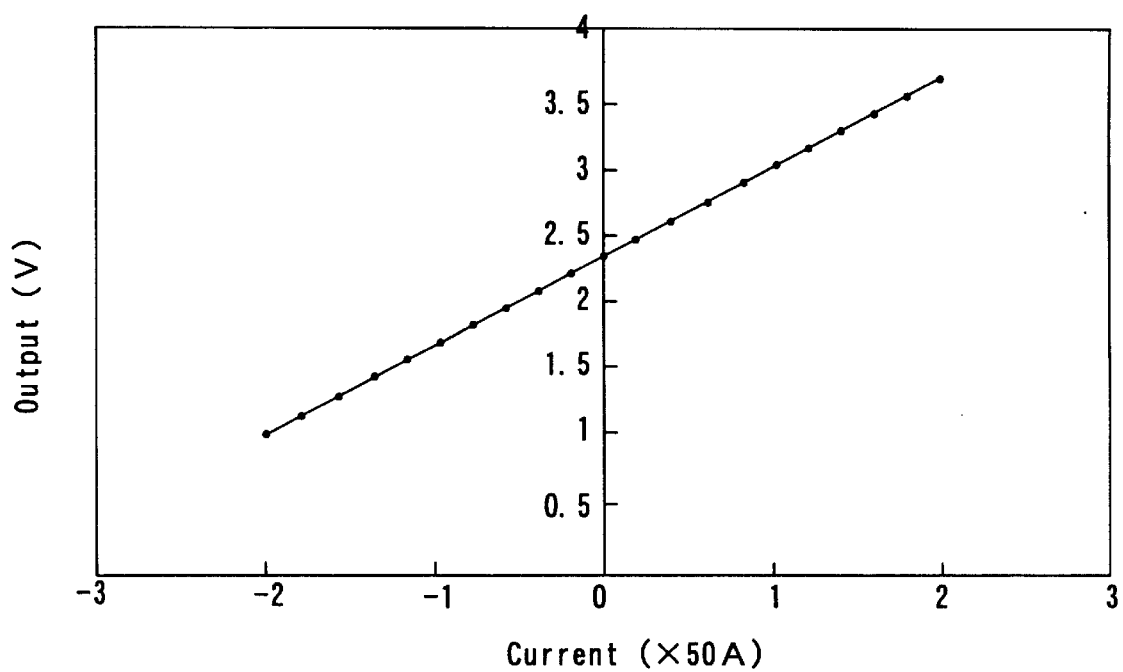
FIG. 12 is a plot illustrating an example of a characteristic of the current sensor apparatus of the eighth embodiment.
Figure 13:
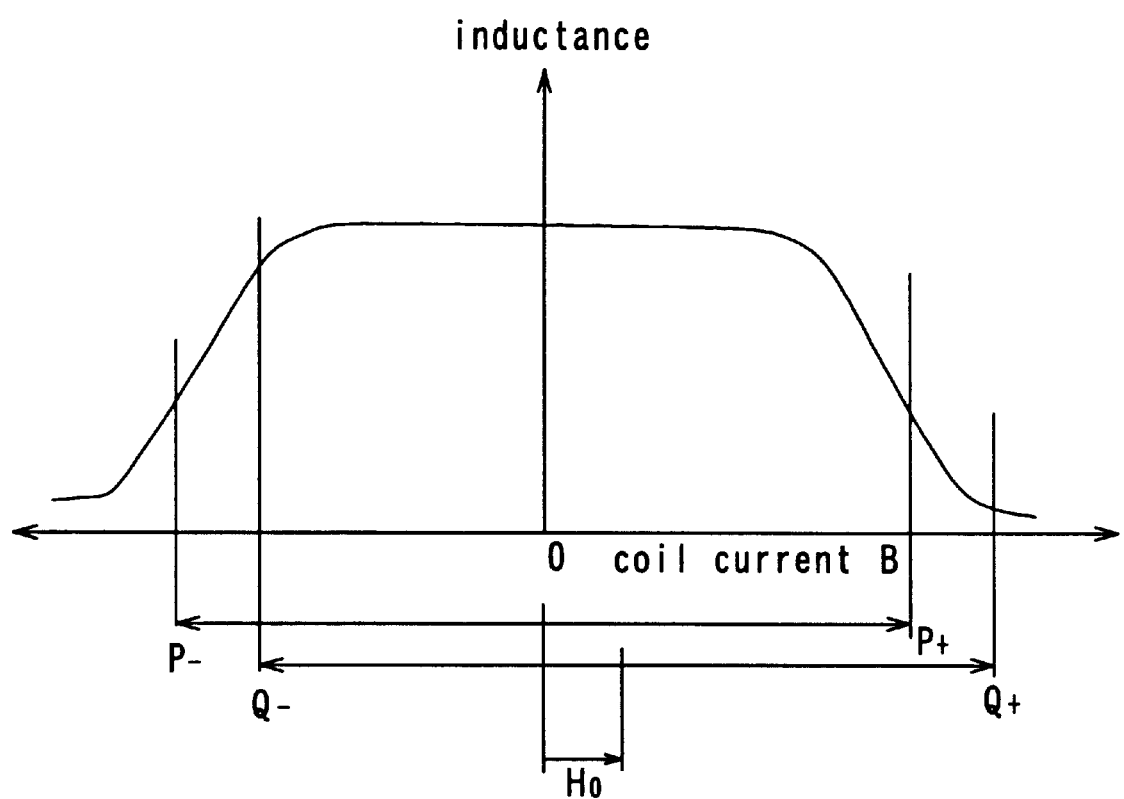
FIG. 13 is an explanatory view for describing the operation principle of a fluxgate element.

FIG. 12 shows an example of the relationship between an output voltage of the current sensor apparatus and a current to be measured passing through the conductor 61 placed inside the magnetic yoke 62. As shown, a linear output voltage characteristic is obtained in a good condition in an extremely wide current range, according to the current sensor apparatus of the embodiment. FIG. 12 shows the output characteristic wherein an offset bias not shown in FIG. 11 is applied.

According to the current sensor apparatus of the embodiment, it is possible to suppress an increase in current consumption due to the negative feedback current to the minimum while the negative feedback method is used. As a result, problems of heating, for example, are prevented. The apparatus therefore contributes to industry and particularly to controlling direct current in an electric car or solar-electric power generation.

According to the embodiment, a resonant current of the resonant circuit is supplied to the coil 2. As a result, an alternating current that drives the core 1 into the saturation region is easily supplied to the coil 2. In addition, the configuration of the apparatus is simple since it is not required to wind any coil for excitation around the core 1 besides the coil 2.

According to the embodiment, the feedback current used for the negative feedback method is supplied to the coil 2 through the coil 6 connected to the coil 2 in parallel in terms of alternating current. As a result, the feedback current is easily supplied to the coil 2 without causing a loss of resonant current.

According to the embodiment, a detection output of the order of volts is easily obtained by inserting the detection coil 20 to the resonant circuit, without reducing value Q of the resonant circuit, that is, without causing insufficiency in resonant current supplied to the coil 2. In addition, the peak hold circuit is implemented by the simple and inexpensive one utilizing the diode and the capacitor. The detection coil 20 is able to obtain a sufficiently large output even when the inductance value thereof is a few percent of the inductance value of the coil 2. Therefore, since the number of turns of the detection coil 20 is small and the saturation current value is sufficiently large in general, the detection coil 20 will not be saturated by the drive current (resonant current) of the coil 2.

Through those techniques, the large amplitude method and the negative feedback method are applicable while a magnetic core, such as a ferrite core, having a large saturation field and large nonlinearity is used. It is thereby possible to use a fluxgate element for detecting a large magnetic field or a large electric current.

The features of the current sensor apparatus of the embodiment, in addition to the feature that an increase in negative feedback current is suppressed, are listed below.

(1) Since the negative feedback method is taken, sensitivity variations are reduced and thermal characteristics are improved automatically.

(2) Thus, no sensitivity adjustment or thermal characteristic compensation is required.

(3) No offset adjustment is required.

(4) The apparatus exhibits excellent properties since the large amplitude excitation method is applied.

(5) No special method is required for fabricating the sensor section.

(6) Since resonant current is utilized, the sensor coil is driven at a low supply voltage and a high frequency.

(7) No special material or method is required for fabricating the apparatus and the circuit is very simple. As a result, the apparatus is manufactured at an extremely low cost and it is possible to meet the great demand.

(8) The apparatus has an excellent frequency response.

(9) Power consumption is low since resonant current is used.

(10) The apparatus is small and light-weight since the configuration is simple.

The magnetic sensor element of the seventh embodiment may be used as the magnetic sensor element of the current sensor apparatus shown in FIG. 11. The shape of the magnetic core is not limited to the one illustrated in the sixth or seventh embodiment but may be any other shape that allows the demagnetizing factor with respect to the applied magnetic field to be different from the demagnetizing factor with respect to the magnetic field generated by the coil.

Although the Clapp oscillation circuit is used as an example of the oscillation circuit in the eighth embodiment, the invention is not limited to the circuit but may be applied to cases where any other oscillation circuit such as a Colpitts oscillation circuit or a Hartley oscillation circuit is utilized.

According to the magnetic sensor element, the magnetic sensor apparatus, or the current sensor apparatus of the invention including the sixth to eighth embodiments, the demagnetizing factor of the magnetic core with respect to the applied magnetic field to be measured is different from the demagnetizing factor of the core with respect to the magnetic field generated by the coil. As a result, when a negative feedback current is supplied to the coil, it is possible to make the current different from the current supplied when the two demagnetizing factors are equal. It is therefore easy to increase the measurement range of magnetic fields or electric currents.

The demagnetizing factor of the core with respect to the applied magnetic field to be measured may be greater than the demagnetizing factor of the core with respect to the magnetic field generated by the coil. As a result, when a negative feedback current is supplied to the coil, it is possible to make the current smaller than the current supplied when the two demagnetizing factors are equal. It is therefore easy to measure a large magnetic field or electric current.

Obviously many modifications and variations of the present invention are possible in the light of the above teachings. It is therefore to be understood that within the scope of the appended claims the invention may be practiced otherwise than as specifically described.

What is claimed is:

1. A magnetic sensor apparatus comprising:
   a magnetic detector for outputting a signal responsive to a magnetic field applied thereto;
   negative feedback means for generating a negative feedback magnetic field to the magnetic detector; and
   a magnetic substance placed around the magnetic detector and having a first demagnetizing factor with respect to a magnetic field to be measured and a second demagnetizing factor with respect to the negative feedback magnetic field, said first and second demagnetizing factors being different from each other.

2. The magnetic sensor apparatus according to claim 1, wherein:
   the magnetic substance has a cavity in which the magnetic detector is disposed.

3. A magnetic sensor apparatus comprising:
   a magnetic detector for outputting a signal responsive to a magnetic field applied thereto; and
   a magnetic substance having a cavity in which the magnetic detector is placed; wherein:
   a ratio between a magnetic field to be measured and the magnetic field applied to the magnetic detector is set at a specific value, based on at least one of a first demagnetizing factor depending on a shape of the magnetic substance and a second demagnetizing factor depending on a shape of the cavity.

4. The magnetic sensor apparatus according to claim 3, wherein the cavity has an opening that opens toward a direction intersecting a direction of passage of a magnetic flux generated by the magnetic field to be measured.

5. The magnetic sensor apparatus according to claim 3, wherein the magnetic detector has a detection sensitivity with a high sensitivity direction and is placed in the cavity such that the high sensitivity direction coincides with a direction of passage of a magnetic flux generated by the magnetic field to be measured.

6. The magnetic sensor apparatus according to claim 3, further comprising negative feedback field application means for applying a negative feedback magnetic field to the magnetic detector.

7. The magnetic sensor apparatus according to claim 6, wherein the negative feedback field application means is placed in the cavity such that a demagnetizing factor of the magnetic substance with respect to the magnetic field to be measured is different from a demagnetizing factor of the magnetic substance with respect to the negative feedback magnetic field.

8. The magnetic sensor apparatus according to claim 3, further comprising a reference field application means for applying a reference alternating magnetic field to the magnetic detector, the reference field being used for controlling a property of the magnetic detector with respect to the magnetic field to be measured.

9. The magnetic sensor apparatus according to claim 8, wherein the reference field application means is placed outside the magnetic substance.

10. A magnetic sensor apparatus comprising:
    a fluxgate magnetic sensor element having a magnetic core and a coil wound around the core, the coil being provided for detecting an applied magnetic field; and
    detection means for detecting a magnetic field to be measured by detecting variations in inductance of the coil; wherein
    the magnetic core has such a shape that a demagnetizing factor thereof with respect to the magnetic field to be measured is different from a demagnetizing factor thereof with respect to a magnetic field generated by the coil.

11. The magnetic sensor apparatus according to claim 10, wherein the magnetic core has such a shape that the demagnetizing factor thereof with respect to the magnetic field to be measured is greater than the demagnetizing factor thereof with respect to the magnetic field generated by the coil.

12. The magnetic sensor apparatus according to claim 10, wherein the magnetic core forms an open magnetic circuit with respect to both the magnetic field to be measured and the magnetic field generated by the coil.

13. The magnetic sensor apparatus according to claim 10, wherein the magnetic core forms an open magnetic circuit with respect to the magnetic field to be measured and forms a closed magnetic circuit with respect to the magnetic field generated by the coil.

14. The magnetic sensor apparatus according to claim 10, further comprising negative feedback means for having the coil generate a negative feedback magnetic field used for negative feedback of an output of the detection means, by supplying a negative feedback current to the coil.

15. A current sensor apparatus for measuring an electric current by measuring a magnetic field generated by the electric current, the apparatus comprising:
    a magnetic detector for outputting a signal responsive to a magnetic field applied thereto;
    negative feedback means for generating a negative feedback magnetic field to the magnetic detector; and
    a magnetic substance placed around the magnetic detector and having a first demagnetizing factor with respect to the magnetic field generated by the electric current and a second demagnitizing factor with respect to the negative feedback magnetic field, the first and second demagnitizing factors being different from each other.

16. The current sensor apparatus according to claim 15, wherein:
    the magnetic has a cavity in which the magnetic detector is placed.

17. A current sensor apparatus for measuring an electric current by measuring a magnetic field generated by the electric current, the apparatus comprising:
    a magnetic detector for outputting a signal responsive to a magnetic field applied thereto; and
    a magnetic substance having a cavity in which the magnetic detector is placed; wherein:
    a ratio between the magnetic field generated by the electric current and the magnetic field applied to the magnetic detector is set at a specific value, based on at least one of a first demagnetizing factor depending on a shape of the magnetic substance and a second demagnetizing factor depending on a shape of the cavity.

18. The current sensor apparatus according to claim 17, wherein the cavity has an opening that opens toward a direction intersecting a direction of passage of a magnetic flux generated by the magnetic field generated by the electric current.

19. The current sensor apparatus according to claim 17, wherein the magnetic detector has a detection sensitivity with a high sensitivity direction and is placed in the cavity such that the high sensitivity direction coincides with a direction of passage of a magnetic flux generated by the magnetic field generated by the electric current.

20. The current sensor apparatus according to claim 17, further comprising negative feedback field application means for applying a negative feedback magnetic field to the magnetic detector.

21. The current sensor apparatus according to claim 20, wherein the negative feedback field application means is placed in the cavity such that a demagnetizing factor of the magnetic substance with respect to the magnetic field generated by the electric current is different from a demagnetizing factor of the magnetic substance with respect to the negative feedback magnetic field.

22. The current sensor apparatus according to claim 17, further comprising a reference field application means for applying a reference alternating magnetic field to the magnetic detector, the reference field being used for controlling a property of the magnetic detector with respect to the magnetic field to be measured.

23. The current sensor apparatus according to claim 22, wherein the reference field application means is placed outside the magnetic substance.

24. A current sensor apparatus for measuring an electric current by measuring a magnetic field generated by the electric current, the apparatus comprising:
a fluxgate magnetic sensor element having a magnetic core and a coil wound around the core, the coil being provided for detecting an applied magnetic field; and
detection means for detecting the magnetic field generated by the electric current by detecting variations in inductance of the coil; wherein
the magnetic core has such a shape that a demagnetizing factor thereof with respect to the magnetic field generated by the electric current is different from a demagnetizing factor thereof with respect to a magnetic field generated by the coil.

25. The current sensor apparatus according to claim 24, wherein the magnetic core has such a shape that the demagnetizing factor thereof with respect to the magnetic field generated by the electric current is greater than the demagnetizing factor thereof with respect to the magnetic field generated by the coil.

26. The current sensor apparatus according to claim 24, wherein the magnetic core forms an open magnetic circuit with respect to both the magnetic field generated by the electric current and the magnetic field generated by the coil.

27. The current sensor apparatus according to claim 24, wherein the magnetic core forms an open magnetic circuit with respect to the magnetic field generated by the electric current and forms a closed magnetic circuit with respect to the magnetic field generated by the coil.

28. The current sensor apparatus according to claim 24, further comprising negative feedback means for having the coil generate a negative feedback magnetic field used for negative feedback of an output of the detection means, by supplying a negative feedback current to the coil.

29. A magnetic sensor apparatus comprising:
a magnetic detector for outputting a signal responsive to a magnetic field applied thereto;
negative feedback means for generating a negative feedback magnetic field to the magnetic detector; and
a magnetic substance forming a part of the magnetic detector and having a first demagnetizing factor with respect to a magnetic field to be measured and a second demagnetizing factor with respect to the negative feedback magnetic field, said first and second demagnetizing factors being different from each other.

30. The magnetic sensor apparatus according to claim 29, wherein:
the magnetic detector has a magnetic core and a coil wound around the magnetic core and that detected the applied magnetic field; and
the magnetic substance is the core forming part of the magnetic detector.

31. A current sensor apparatus for measuring an electric current by measuring a magnetic field generated by the electric current, the apparatus comprising:
a magnetic detector for outputting a signal responsive to a magnetic field applied thereto;
negative feedback means for generating a negative feedback magnetic field to the magnetic detector; and
a magnetic substance forming a part of the magnetic detector and having a first demagnetizing factor with respect to the magnetic field generated by the electric current and a second demagnetizing factor with respect to the negative feedback magnetic field, the first and second demagnetizing factors being different from each other.

32. The current sensor apparatus according to claim 31, wherein:
the magnetic detector has a magnetic core and coil wound around the magnetic core and that detects the applied magnetic field; and
the magnetic substance is the magnetic fore forming part of the magnetic detector.

* * * * *

UNITED STATES PATENT AND TRADEMARK OFFICE
CERTIFICATE OF CORRECTION

PATENT NO. : 6,323,634 B1 Page 1 of 1
DATED : November 27, 2001
INVENTOR(S) : Shiro Nakagawa et al.

It is certified that error appears in the above-identified patent and that said Letters Patent is hereby corrected as shown below:

Column 4,
Line 26, please change "P." to -- $P_-$ --.

Column 9,
Line 55, after "is" please insert -- directly wound around the magnetic detector 101 as long as the negative feedback field is --.

Column 13,
Line 1, please change "(1)" to -- (2) --.

Column 17,
Line 50, please change "current-to" to -- current to --.

Column 30,
Line 56, after "magnetic" (first occurrence) please insert -- substance --.

Column 32,
Line 29, please change "detected" to -- detects --, and
Line 31, before "core" please insert -- magnetic --.
Line 53, please change "fore" to -- core --.

Signed and Sealed this

Thirteenth Day of August, 2002

Attest:

Attesting Officer

JAMES E. ROGAN
*Director of the United States Patent and Trademark Office*